(12) United States Patent
Izawa

(10) Patent No.: US 9,742,447 B2
(45) Date of Patent: Aug. 22, 2017

(54) CLOCK SIGNAL GENERATING APPARATUS, CLOCK SIGNAL GENERATING METHOD, AND MEDIUM

(71) Applicant: Yasuhiro Izawa, Hyogo (JP)

(72) Inventor: Yasuhiro Izawa, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/969,524

(22) Filed: Dec. 15, 2015

(65) Prior Publication Data

US 2016/0191284 A1  Jun. 30, 2016

(51) Int. Cl.
| | | |
|---|---|---|
| H04L 7/033 | (2006.01) | |
| H04B 1/04 | (2006.01) | |
| H04B 15/04 | (2006.01) | |
| H03C 3/09 | (2006.01) | |
| H03L 7/18 | (2006.01) | |

(52) U.S. Cl.
CPC ......... *H04B 1/0475* (2013.01); *H03C 3/0916* (2013.01); *H03C 3/0975* (2013.01); *H03L 7/18* (2013.01); *H04B 15/04* (2013.01)

(58) Field of Classification Search
USPC ......................................................... 375/376
See application file for complete search history.

(56) References Cited

U.S. PATENT DOCUMENTS

| | | | | |
|---|---|---|---|---|
| 8,421,508 B2 * | 4/2013 | Hirai | ........................ | H03L 7/197 327/156 |
| 2003/0131155 A1 * | 7/2003 | Hsu | ......................... | H03L 7/081 710/1 |
| 2003/0198311 A1 * | 10/2003 | Song | ..................... | H03C 3/0925 375/376 |
| 2006/0245531 A1 * | 11/2006 | Leonowich | ........... | H03L 7/1976 375/376 |
| 2012/0235717 A1 | 9/2012 | Hirai et al. | | |
| 2014/0002151 A1 | 1/2014 | Watabe et al. | | |
| 2015/0229024 A1 * | 8/2015 | McCune, Jr. | ........ | H01Q 3/2605 342/368 |

FOREIGN PATENT DOCUMENTS

| | | |
|---|---|---|
| JP | 2012-195824 | 10/2012 |
| JP | 2012-195826 | 10/2012 |

* cited by examiner

*Primary Examiner* — Eva Puente
(74) *Attorney, Agent, or Firm* — Oblon, McClelland, Maier & Neustadt, L.L.P.

(57) ABSTRACT

A clock signal generating apparatus detects a phase difference between an input reference clock signal and a feedback signal to output a control signal based on the phase difference, generates the clock signal with a frequency based on the output control signal, generates a pattern by switching, at a certain time interval, between a plurality of patterns of a second phase shift amount, adds a first phase shift amount to the second phase shift amount having the generated pattern, determines a phase to be selected, so that a cycle of the phase-shifted clock signal matches the cycle of a clock signal changed by the first phase shift amount to which the second phase shift amount is added, selects the determined phase from among a plurality of phases, and generates a phase-shifted clock signal whose signal level changes in the selected phase for output as the feedback signal.

16 Claims, 16 Drawing Sheets

CLOCK SIGNAL GENERATING APPARATUS, CLOCK SIGNAL GENERATING METHOD, AND MEDIUM

CROSS-REFERENCE TO RELATED APPLICATIONS

This patent application is based on and claims priority pursuant to 35 U.S.C. §119(a) to Japanese Patent Application No. 2014-264235, filed on Dec. 26, 2014, in the Japan Patent Office, the entire disclosure of which is hereby incorporated by reference herein.

BACKGROUND

Technical Field

The present invention relates to a clock signal generating apparatus, a method for generating a clock signal, and a non-transitory recording medium storing a program for causing a computer to execute the clock signal generating method.

Description of the Related Art

Electronic devices such as computers include a plurality of circuits such as a central processing unit (CPU), and each circuit operates in accordance with a clock signal (sync signal) that repeatedly oscillates between a high and a low state in a certain cycle. A clock signal is generated by a crystal oscillator that generates a pulse at a certain time interval. All clock signals required by the individual circuits do not have the same frequency. Therefore, a variable frequency generating circuit such as a phase locked loop (PLL) circuit is used to change the frequency of a clock signal generated by a crystal oscillator, thereby generating a clock signal with a frequency required by each circuit.

Because electric current that flows through wiring or the like changes, a clock signal generates electromagnetic interference (EMI) that has such effects as obstructing the operation of an external device. EMI has a peak at a particular frequency, and the above-described effects are caused by a strong electromagnetic wave radiated at that peak.

SUMMARY

Example embodiments of the present invention include a clock signal generating apparatus, which includes a detector, a generator, a phase selector, and a phase controller. The detector detects a phase difference between an input reference clock signal serving as a reference and a feedback signal, and outputs a control signal in accordance with the phase difference. The generator generates the clock signal with a frequency in accordance with the control signal output from the detector. The phase selector selects one of a plurality of phases obtained by equally dividing one cycle of the clock signal generated by the generator into a certain number, generates a phase-shifted clock signal whose signal level changes in the selected phase, and outputs the generated phase-shifted clock signal as the feedback signal to the detector. The phase controller determines a phase to be selected by the phase selector, on the basis of the cycle of the clock signal generated by the generator, and a first phase shift amount determined in advance for changing the cycle. The phase controller generates a pattern by switching, at a certain time interval, between a plurality of patterns of a second phase shift amount that periodically changes every certain time, adds the first phase shift amount to the second phase shift amount having the generated pattern, and determines a phase to be selected by the phase selector so that a cycle of the phase-shifted clock signal matches the cycle of the clock signal changed by the first phase shift amount to which the second phase shift amount having the generated pattern is added.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
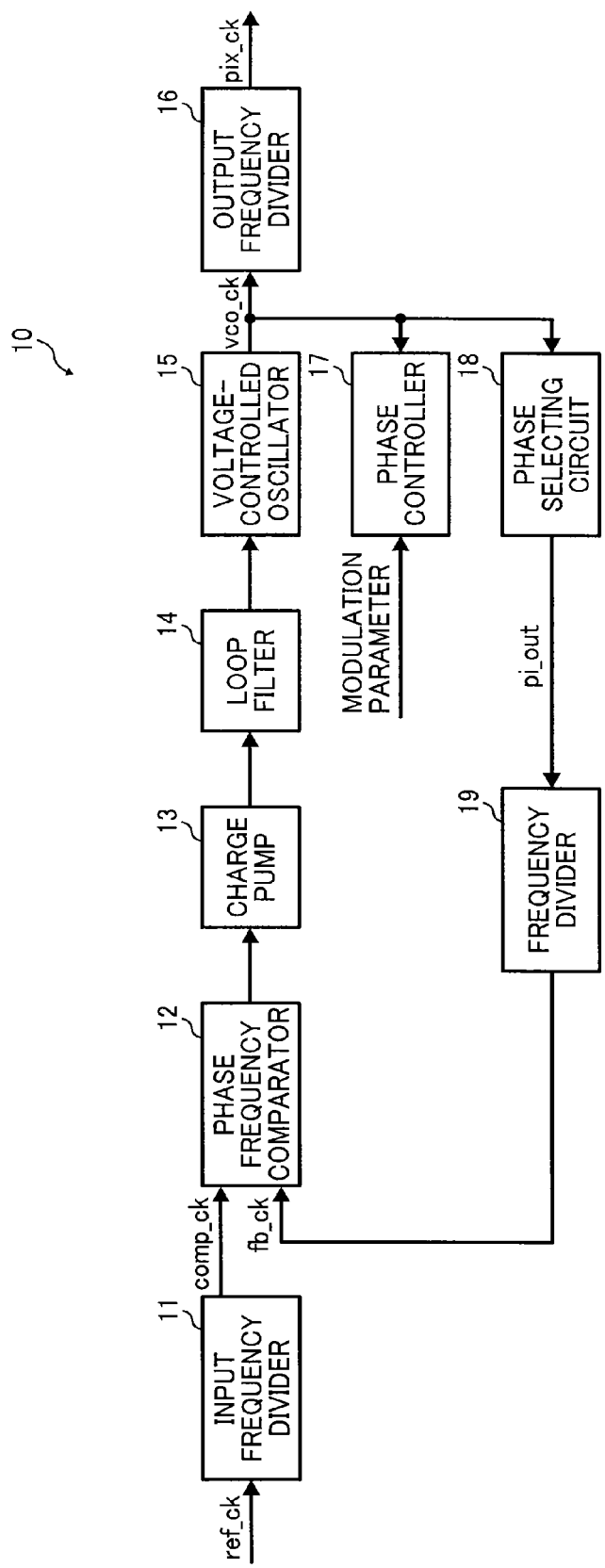
FIG. 1 is a diagram illustrating an exemplary configuration of an SSCG circuit serving as a clock signal generating apparatus according to an embodiment.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware at existing network elements or control nodes. Such existing hardware may include one or more Central Processing Units (CPUs), digital signal processors (DSPs), application-specific-integrated-circuits, field programmable gate arrays (FPGAs) computers or the like. These terms in general may be referred to as processors.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

FIG. 1 is a diagram illustrating an exemplary configuration of a spread spectrum clock generating (SSCG) circuit serving as a clock signal generating apparatus according to an embodiment. Although the SSCG circuit will be discussed hereinafter, the SSCG circuit is merely an example, and the clock signal generating apparatus is not construed to be limited to the SSCG circuit. The SSCG circuit divides the frequency of a clock signal input from an oscillator that generates a reference clock signal serving as a reference, and generates and outputs a clock signal that has a certain frequency and a certain phase, which is used in the operation of another circuit or the like. The SSCG circuit is a circuit that can achieve the above-described EMI reduction effect, and is configured as a fractional PLL circuit that is a phase synchronizing circuit capable of performing fractional frequency division.

Referring to FIG. 1, an SSCG circuit 10 includes an input frequency divider 11, a phase frequency comparator 12, a charge pump 13, a loop filter 14, a voltage-controlled oscillator (VCO) 15, and an output frequency divider 16. The SSCG circuit 10 further includes a phase controller 17, a phase selecting circuit 18, and a frequency divider 19.

The input frequency divider 11 accepts an input of a reference clock signal ref_ck generated by the oscillator, divides the frequency of the reference clock signal ref_ck and outputs the result as an input clock signal comp_ck to the phase frequency comparator 12. Frequency division is an operation of reducing the frequency. Like the output frequency divider 16 and the frequency divider 19, the input frequency divider 11 has a settable division ratio setting value, and, on the basis of the setting value, divides the frequency of the input clock signal. For example, when the setting value n is 2, the division ratio n+1 is 3; thus, the frequency of the input clock signal is divided by three to obtain one third of the frequency, which is then output.

The phase frequency comparator 12 accepts the input clock signal comp_ck output from the input frequency divider 11, and a feedback signal fb_ck output from the frequency divider 19, and detects the phase difference between these two signals. A phase is a dimensionless amount indicating the position of a signal in one cycle. A phase difference can be obtained as, for example, a difference between a rising edge of the input clock signal comp_ck, which rises from low to high, and a rising edge of the feedback signal fb_ck.

The phase frequency comparator 12 outputs the detected phase difference to the charge pump 13. The charge pump 13 increases or decreases a charge pump voltage in accordance with the phase difference output from the phase frequency comparator 12, and outputs that charge pump voltage to the loop filter 14. The loop filter 14 generates a controlled voltage in accordance with the charge pump voltage, and outputs the controlled voltage as a control signal to the VCO 15. The phase frequency comparator 12, the charge pump 13, and the loop filter 14 function as a detector that detects the phase difference and outputs the control signal.

The VCO 15 generates and outputs a clock signal (output clock signal) vco_ck that has a frequency and a phase in accordance with the control signal. Therefore, the VCO 15 functions as a generator that generates the output clock signal. The output frequency divider 16 divides the frequency of the output clock signal vco_ck for use in another circuit such as a CPU, and outputs the result as, for example, a pixel clock signal pix_ck.

The VCO 15 additionally outputs the output clock signal vco_ck to the phase controller 17 and the phase selecting circuit 18, besides to the output frequency divider 16. The phase controller 17, the phase selecting circuit 18, and the frequency divider 19 are configured as a feedback circuit that feeds the output clock signal vco_ck back to the phase frequency comparator 12. The phase selecting circuit 18 operates under control of the phase controller 17, and the frequency divider 19 has a division ratio setting value of a fixed integer, and performs frequency division on the basis of that setting value.

The phase selecting circuit 18 generates a modulated clock signal pi_out by changing the phase whose signal level of the output clock signal vco_ck changes, such as the phase of a rising edge, and outputs the modulated clock signal pi_out to the frequency divider 19. Specifically, the phase selecting circuit 18 selects one of a plurality of phases that are obtained by equally dividing one cycle of the output clock signal vco_ck into a certain number, and generates a phase-shifted clock signal pi_out whose signal level changes in the selected phase. Therefore, the phase selecting circuit 18 functions as a phase selector that selects the phase. The phase selecting circuit 18 outputs the phase-shifted clock signal pi_out as a feedback signal to the phase frequency comparator 12 via the frequency divider 19.

The phase controller 17 functions as a phase controller, and, on the basis of the cycle of the output clock signal vco_ck and a predetermined phase shift amount Δph (an integer multiple of the above equally-divided phase) for changing that cycle, determines a phase to be selected by the phase selecting circuit 18. Specifically, the phase controller 17 determines the phase of a rising edge of the phase-shifted clock signal pi_out so that the cycle of the phase-shifted clock signal pi_out matches the cycle of the output clock signal vco_ck changed by about the phase shift amount Δph.

The SSCG circuit 10 performs negative feedback control so that the frequency and phase of the feedback signal fb_ck match the frequency and phase of the input clock signal comp_ck. In addition, the SSCG circuit 10 generates a phase-shifted clock signal pi_out that has a cycle obtained by the phase selecting circuit 18 by changing the cycle of the output clock signal vco_ck by about the phase shift amount Δph. Accordingly, the frequency divider 19 can implement not only a division ratio of a fixed integer, but also a division ratio of a rational number.

In the case where the phase shift amount Δph is positive, the frequency of the feedback signal fb_ck becomes higher than the frequency of the input clock signal comp_ck. In the case where the phase shift amount Δph is negative, the frequency of the feedback signal fb_ck becomes lower than the frequency of the input clock signal comp_ck. In the SSCG circuit 10, by changing the cycle of the phase-shifted clock signal pi_out by the phase selecting circuit 18, the frequency of the output clock signal vco_ck can be spread-spectrum (SS) modulated.

In the case where the phase selecting circuit 18 generates a phase-shifted clock signal pi_out that has a cycle obtained by changing the cycle of the output clock signal vco_ck, the phase selecting circuit 18 can divide the frequency of the output clock signal vco_ck. In addition, when the output frequency divider 16 has a division ratio of 2 or greater, the phase selecting circuit 18 can further divide the frequency of the output clock signal vco_ck while taking into consideration this division ratio. In this case, it is assumed that the division ratio setting value of the phase selecting circuit 18 is represented as div_puck and div_puck=0, 1, 2, . . . , and, when div_puck=n (n is an integer greater than or equal to 0), it is assumed that the division ratio is n+1. Similarly, it is assumed that the division ratio setting value of the output frequency divider 16 is represented as div_pll and div_pll=0, 1, 2, . . . , and, when div_pll=n, it is assumed that the division ratio is n+1. Furthermore, it is assumed that the division ratio setting value of the frequency divider 19 is represented as div_fb and div_fb=0, 1, 2, . . . , and, when div_fb=n, it is assumed that the division ratio is n+1. Therefore, the division ratio of the feedback signal fb_ck to the output clock signal vco_ck is the product of the division ratio of the phase selecting circuit 18, the division ratio of the output frequency divider 16, and the division ratio of the frequency divider 19.

The output frequency divider 16 can have two or more division ratios. For example, using two division ratios, the output frequency divider 16 can perform frequency division into an output clock signal vco_ck with a frequency of 60 to 120 MHz, and a pixel clock signal pix_ck with a frequency of 5 to 40 MHz.

Figure 2:
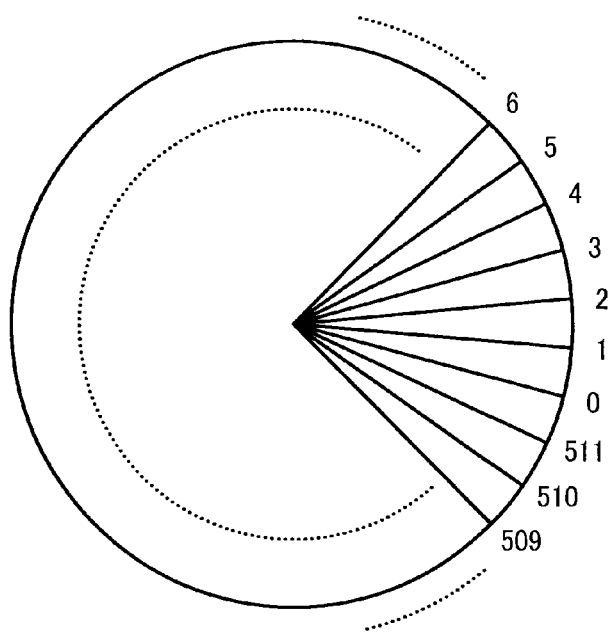
FIG. 2 is a diagram describing the phase of an output clock signal selected by a phase selecting circuit.
Figure 3:
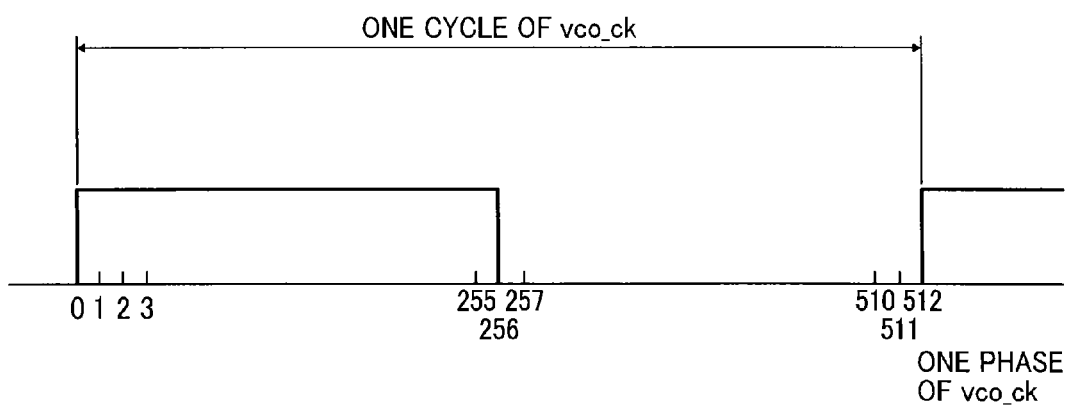
FIG. 3 is a diagram describing the phase of an output clock signal selected by the phase selecting circuit.

Referring to FIGS. 2 and 3, the phase of the output clock signal vco_ck selected by the phase selecting circuit 18 illustrated in FIG. 1 will be described. In the case where one cycle of the output clock signal vco_ck is represented by a circle and the cycle (circle) is divided into 512 pieces, which is a certain number, the result becomes as illustrated in FIG. 2. When this is represented on a rectangular wave, the result becomes as illustrated in FIG. 3. Positions represented by numerals 1, 2, 3, . . . , 511, and 512 are phases.

There are one high and one low signal level within one clock of the output clock signal vco_ck, and the position (phase) 512 where the signal level changes from low to high is referred to as the above-mentioned rising edge. In contrast, the position (phase) 256 where the signal level changes from high to low is referred to as a falling edge. Since the phase selecting circuit 18 selects an arbitrary phase in order to interpolate a rising edge, the phase selecting circuit 18 functions as a phase interpolator.

Figure 4:
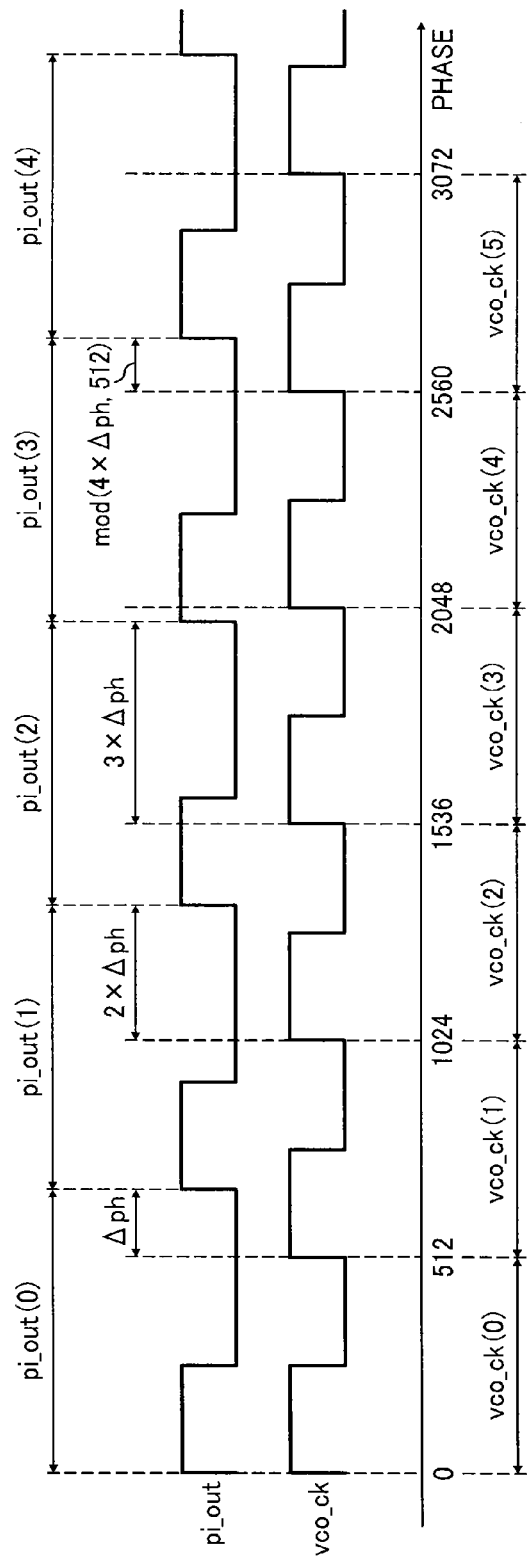
FIG. 4 is a timing chart indicating a phase shift in the case where the phase shift amount is positive.

Referring to FIG. 4, a phase shift of the phase selecting circuit 18 in the case where the phase shift amount Δph is positive will be described. That is, this is an operation of changing the cycle of the output clock signal vco_ck by about the phase shift amount Δph in a positive direction. To simplify the description, it is assumed that the division ratio setting values of the phase selecting circuit 18, the output frequency divider 16, and the frequency divider 19 are div_puck=0, div_fb=0, and div_pll=0, respectively, and the division ratios are 1. The abscissa axis illustrated in FIG. 4 has, as a unit, a phase obtained by equally dividing one cycle of the output clock signal vco_ck into 512 pieces, which is a certain number. It is also assumed that the phase of a rising edge of the phase-shifted clock signal pi_out(0) matches the phase of a rising edge of the output clock signal vco_ck(0).

In the example illustrated in FIG. 4, pi_out increases at a time by Δph, such as follows: pi_out(1)=vco_ck(0)+Δph; pi_out(1) i=vco_ck(1)+2×Δph, and pi_out(2)=vco_ck(2)+3×Δph. Therefore, the rising edge of the phase-shifted clock signal pi_out is delayed every clock by the phase shift amount Δph from the output clock signal vco_ck.

Because the rising edge is shifted every clock by the phase shift amount Δph, in order to obtain an appropriate phase-shifted clock signal pi_out, it is necessary to know at which position of which clock of the output clock signal vco_ck, the rising edge of the phase-shifted clock signal pi_out is. As that position, using the phases (0 to 511) obtained by equally dividing one cycle of the output clock signal vco_ck into 512 pieces, the phase selecting circuit 18 selects any one of these phases as the current phase.

In the case where the sum of the current phase and the phase shift amount Δph is less than one cycle of the clock of the output clock signal vco_ck, the rising edge of the next clock of the phase-shifted clock signal pi_out is positioned at a corresponding phase within the cycle of the next clock. Being less than one cycle refers to the case where the phase after the increase is less than or equal to 511. Therefore, the phase selecting circuit 18 is able to select that corresponding phase.

In contrast, in the case where the sum is greater than or equal to one cycle, the rising edge of the next clock of the phase-shifted clock signal pi_out is not positioned within the cycle of the next clock of the output clock signal vco_ck. The rising edge of the next clock is positioned at a phase obtained by subtracting 512 from the phase after the increase, which is within the cycle of the next clock.

Figure 5:
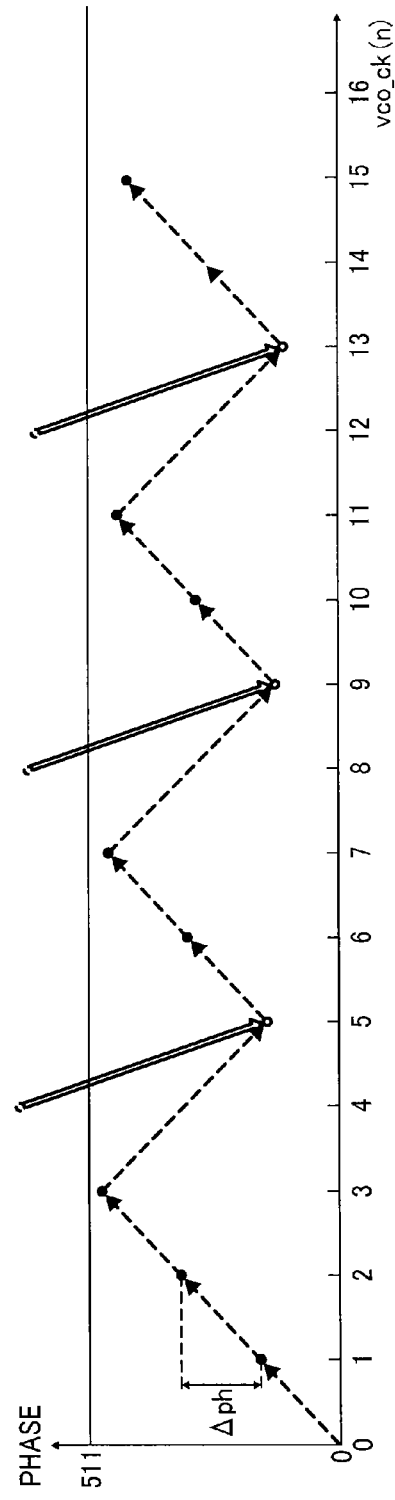
FIG. 5 is a diagram illustrating a phase selected by the phase selecting circuit in the case of performing the phase shift illustrated in FIG. 4.

In this case, as illustrated in FIG. 4, for example, the rising edge of the fifth clock pi_out(4) of the phase-shifted clock signal is not positioned within the cycle of the fifth clock vco_ck(4) of the output clock signal, but is within the cycle of the next sixth clock vco_ck(5). That phase is the position obtained by adding the remainder of the 4×Δph divided by 512, that is, mod(4×Δph, 512), to the rising edge of the sixth clock vco_ck(5) of the output clock signal. This is indicated by arrows in FIG. 5. Instead of selecting phases indicated by white circles on a broken line of the clocks vco_ck(4), vco_ck(8), and vco_ck(12) of the output clock signal, the phase selecting circuit 18 can select phases indicated by white circles on a solid line of the next clocks.

By selecting the phases as described above, the cycle of each phase-shifted clock signal pi_out can always be the length obtained by increasing the cycle of the output clock signal vco_ck by the phase shift amount Δph at a time.

Figure 6:
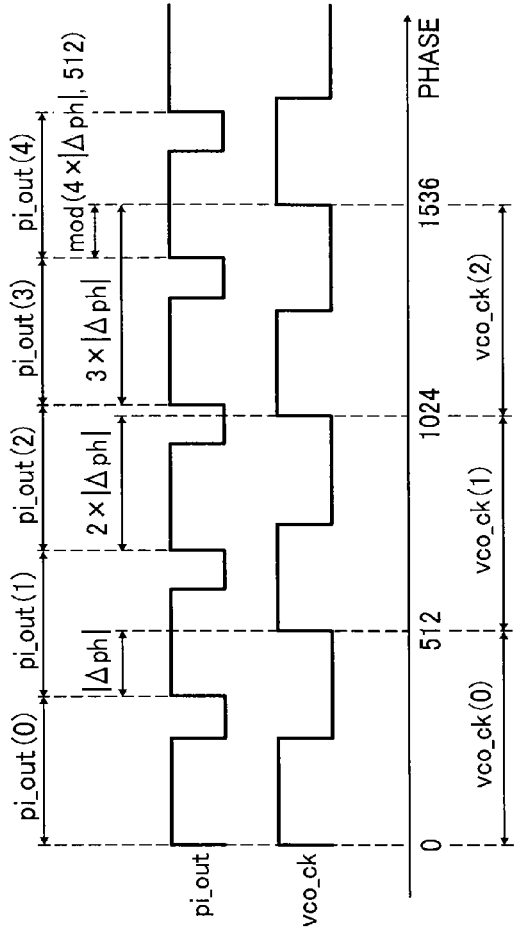
FIG. 6 is a timing chart indicating a phase shift in the case where the phase shift amount is negative.
Figure 7:
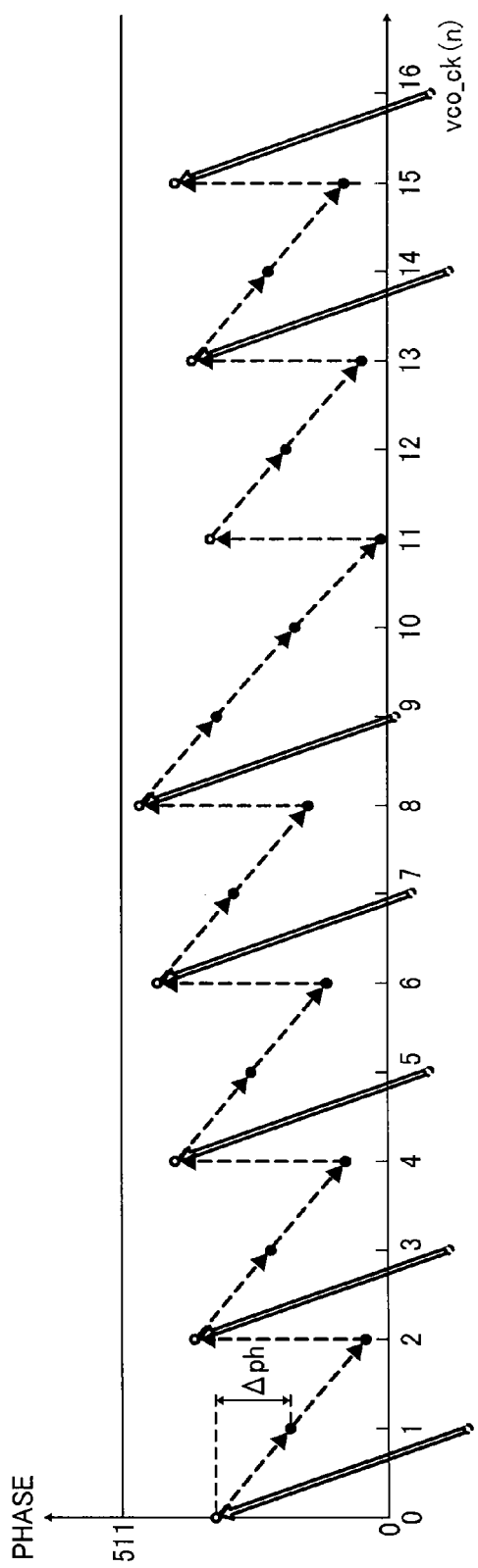
FIG. 7 is a diagram illustrating a phase selected by the phase selecting circuit in the case of performing the phase shift illustrated in FIG. 6.

So far, the case where the phase shift amount Δph is positive has been described. Next, the case where the phase shift amount Δph is negative will be briefly described. In the case where the phase shift amount Δph is positive, the cycle of the phase-shifted clock signal pi_out is the cycle of the output clock signal vco_ck increased at a time by the phase shift amount Δph. In the case where the phase shift amount Δph is negative, conversely, the cycle of the phase-shifted clock signal pi_out is the cycle of the output clock signal vco_ck deceased at a time by the phase shift amount Δph, as illustrated in FIGS. 6 and 7. Therefore, in the examples illustrated in FIGS. 6 and 7, pi_out decreases at a time by Δph, as follows: pi_out(0)=vco_ck(0)−Δph; pi_out(1)=vco_ck(1)−2×Δph, and pi_out(2)=vco_ck(2)−3×Δph. Therefore, the rising edge of each of the phase-shifted clock signal pi_out is advanced every clock by the phase shift amount Δph from the output clock signal vco_ck.

Because the rising edge is shifted every clock by the phase shift amount Δph, in order to obtain an appropriate phase-shifted clock signal pi_out, it is necessary to know at which position of which clock of the output clock signal vco_ck, the rising edge of the phase-shifted clock signal pi_out is. As that position, using the phases (0 to 511) obtained by equally dividing one cycle of the output clock signal vco_ck into 512 pieces, the phase selecting circuit 18 selects any one of these phases as the current phase.

In the case where the phase after the decrease by the phase shift amount Δph does not become negative, the rising edge of the next clock of the phase-shifted clock signal pi_out is positioned at a corresponding phase within the cycle of the next clock of the output clock signal vco_ck. Therefore, the phase selecting circuit 18 is able to select that corresponding phase. In contrast, in the case where the phase after the decrease becomes negative, the rising edge of the next clock of the phase-shifted clock signal pi_out is not positioned within the next clock of the output clock signal vco_ck, but is at a phase obtained by adding 512 to the phase after the decrease, which is within the cycle of the current clock.

Therefore, in the case where the above-mentioned phase after the decrease becomes negative, as illustrated in FIG. 6, the rising edge of the fifth clock pi_out(4) of the phase-shifted clock signal is not positioned within the cycle of the fourth clock vco_ck(3) of the output clock signal, but is within the cycle of the third clock vco_ck(2). That phase is advanced by the remainder of the 4×Δph divided by 512, that is, mod(4×Δph, 512), from the rising edge of the fourth clock vco_out(3) of the output clock signal. This is indicated by arrows in FIG. 7. Instead of selecting phases indicated by white circles on a broken line of the clocks vco_ck(1), vco_ck(3), . . . of the output clock signal, the phase selecting circuit 18 can select phases indicated by white circles on a solid line of the previous clocks.

By selecting the phases as described above, the cycle of each phase-shifted clock signal pi_out can always be the length obtained by decreasing the cycle of the output clock signal vco_ck by the phase shift amount Δph at a time.

The phase controller 17 determines the phase of the rising edge of the phase-shifted clock signal pi_out, as has been described above, and causes the phase selecting circuit 18 to select that phase and to generate a phase-shifted clock signal that has the rising edge at that phase. Therefore, the phase controller 17 controls the phase selecting circuit 18 in accordance with the determined phase. At this time, the phase controller 17 determines the phase of the above-mentioned rising edge so that the cycle of the phase-shifted clock signal pi_out becomes a length obtained by changing the cycle of the output clock signal vco_ck by the phase shift amount Δph. In this case, if the frequency of the phase-shifted clock signal pi_out is fpi_out and the frequency of the output clock signal vco_ck is fvco_ck, the following equation holds between these frequencies:

$$fpi\_out = \frac{fvco\_ck \times 512}{512 + \Delta ph} \quad \text{[Formula 1]}$$

At this time, the fractional PLL circuit performs feedback control so that the frequency and phase of the feedback signal fb_ck match the frequency and phase of the input clock signal comp_ck. Therefore, if the frequency of the input clock signal comp_ck is fcomp_ck and the frequency of the feedback signal is ffb_ck, the following equation holds between these frequencies:

$$ffb\_ck = fpi\_out = fcomp\_ck \quad \text{[Formula 2]}$$

By substituting equation 2 into equation 1, the following equation 3 is derived, and the following equation 3 is modified to derive the following equation 4:

$$fcomp\_ck = \frac{fvco\_ck \times 512}{512 + \Delta ph} \quad \text{[Formula 3]}$$

$$fvco\_ck = fcomp\_ck \times \left(1 + \frac{\Delta ph}{512}\right) \quad \text{[Formula 4]}$$

In this example, the case where the number of divisions in the case of equally dividing one cycle of the output clock signal vco_ck, which is the resolution of the phase selecting circuit 18, is 512 has been described so far. By improving the resolution as above, a very small multiplication rate (such as a multiplication rate less than or equal to 1%) can be implemented. In this example, the minimum multiplication rate is 1/512=about 0.002, that is, 0.2%.

So far, it is assumed that the division ratios of the phase selecting circuit 18, the output frequency divider 16, and the frequency divider 19 are 1, that is, their setting values are div_puck=0, div_fb=0, and div_pll=0, respectively. Next, the case where the setting values are 1 or greater will be described with reference to FIGS. 8 to 11. In this case, the setting values div_puck, div_fb, and div_pll are all set to 2, and the division ratios are set to 3.

Figure 8:
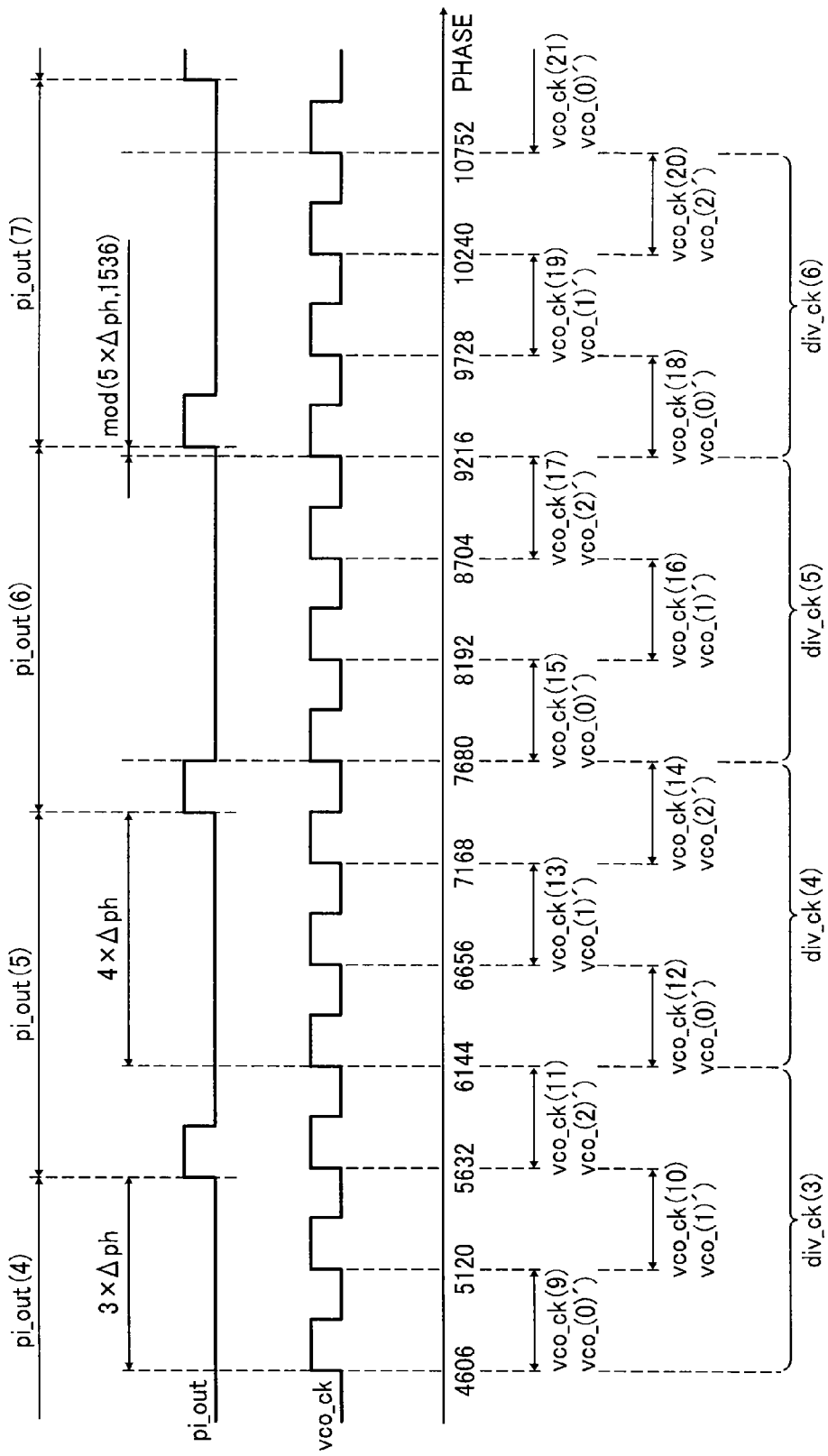
FIG. 8 is a timing chart indicating another phase shift in the case where the phase shift amount is positive.

FIG. 8 is a timing chart indicating a phase shift in the case where the phase shift amount Δph is positive. Every three clocks of the output clock signal vco_ck, the frequency-divided clock signal div_ck of the phase selecting circuit 18 is set. For example, for the tenth to twelfth clocks vco_ck(9) to vco_ck(11) of the output clock signal vco_ck, the fourth clock div_ck(3) of the frequency-divided clock signal div_ck is set. In this case, in each clock of the frequency-divided clock signal div_ck, three clocks of the output clock signal vco_ck are referred to as first to third subclocks vco_ck(0)', vco_ck(1)', and vco_ck(2)', respectively.

In the example illustrated in FIG. 8, the cycle of the phase-shifted clock signal pi_out is the cycle of three clocks of the output clock signal vco_ck (the cycle of the frequency-divided clock signal div_ck) increased by the phase shift amount Δph. That is, the cycle of the phase-shifted clock signal pi_out becomes 512×3+Δph. Therefore, the rising edge of each clock of the phase-shifted clock signal pi_out is increased every clock by the phase shift amount Δph from the rising edge after three clocks of the output clock signal vco_ck, and is thus delayed. Note that it is assumed that the rising edge of the first clock vco_ck(0) of the output clock signal matches the rising edge of the second clock pi_out(1) of the phase-shifted clock signal.

The rising edge of the second clock pi_out(1) of the phase-shifted clock signal is delayed by the phase shift amount Δph from the rising edge of the fourth clock vco_ck (3) of the output clock signal. The rising edge of the third clock pi_out(2) of the phase-shifted clock signal is delayed by twice the phase shift amount Δph from the rising edge of the seventh clock vco_ck(6) of the output clock signal. From this, the rising edge of the n-th clock pi_out(n−1) of the phase-shifted clock signal is delayed by an n−1 multiple of the phase shift amount Δph from the rising edge of the (3n−2)-th clock vco_ck(3n−3) of the output clock signal.

Figure 9:
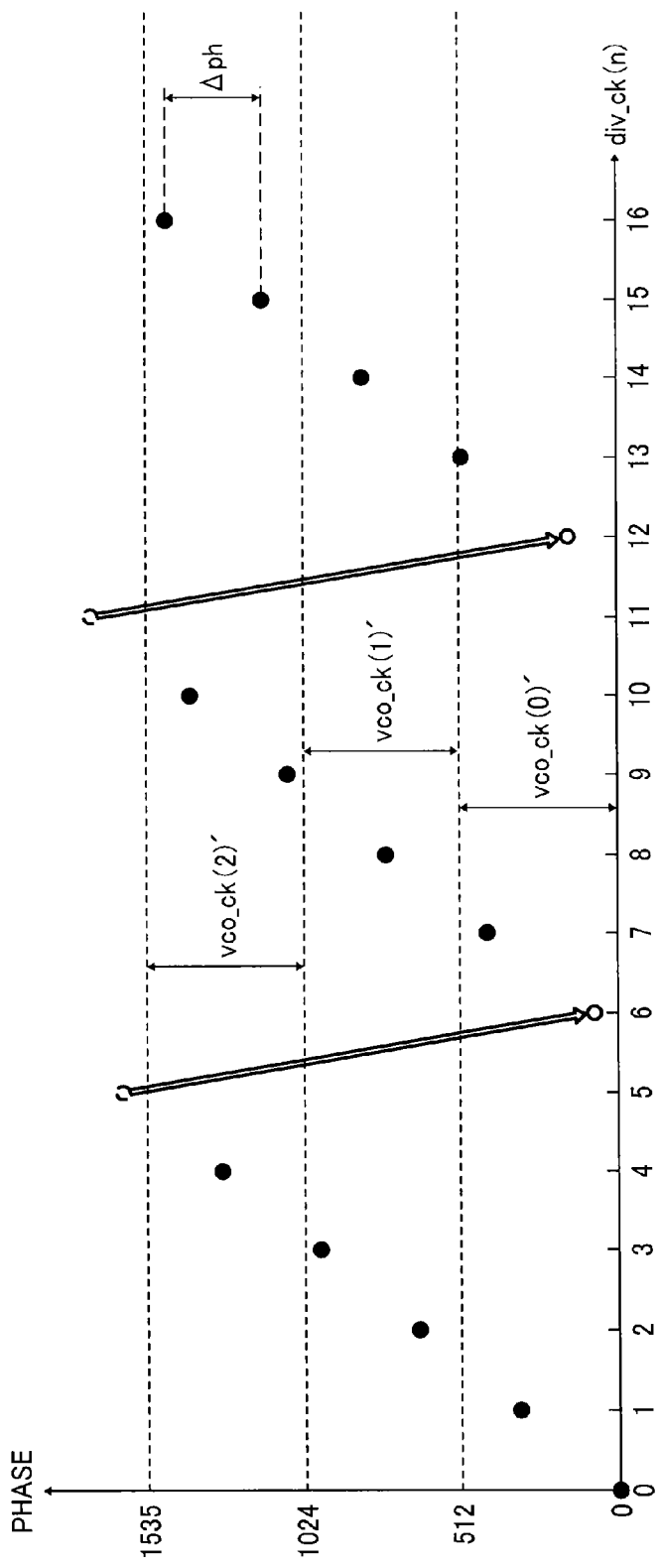
FIG. 9 is a diagram illustrating a phase selected by the phase selecting circuit in the case of performing the phase shift illustrated in FIG. 8.

FIG. 9 is a diagram illustrating a phase selected by the phase selecting circuit 18 in the case of performing the phase shift illustrated in FIG. 8. The phase selecting circuit 18 selects, as the current phase, any one of the phases 0 to 1535 obtained by equally dividing one cycle of the clock of the output clock signal vco_ck into 512 pieces, that is, equally dividing the cycle of the frequency-divided clock signal div_ck into 1536 pieces. Every time the clock of the frequency-divided clock signal div_ck advances, the phase selecting circuit 18 selects a phase increased at a time by the phase shift amount Δph as the new current phase.

In the case where the sum of the current phase and the phase shift amount Δph is less than one cycle of the frequency-divided clock signal div_ck, the rising edge of the next clock of the phase-shifted clock signal pi_out is positioned at a corresponding phase within the cycle of the next clock of the frequency-divided clock signal div_ck. Therefore, the phase selecting circuit 18 is able to select that corresponding phase.

In contrast, in the case where the sum is greater than or equal to one cycle, the sum of the current phase and the phase shift amount Δph is positioned at a phase obtained by decreasing the phase after the increase by about 1536, which is within the cycle after two clocks of the frequency-divided clock signal div_ck. In this case, as illustrated in FIG. 8, the rising edge of the eighth clock pi_out(7) of the phase-shifted clock signal is at a position obtained by adding mod(S×Δph, 1536), which is the reminder of S×Δph divided by 1536, to the head of the seventh clock div_ck(6) of the frequency-divided clock signal. Therefore, in this case, the phase selecting circuit 18 is able to select a phase at that position.

By selecting the phase as described above, the cycle of each clock pi_out(0), pi_out(1), . . . , pi_out(n−1) of the phase-shifted clock signal can always be a length obtained by increasing the cycle of three clocks of the output clock signal vco_ck by the phase shift amount Δph.

Figure 10:
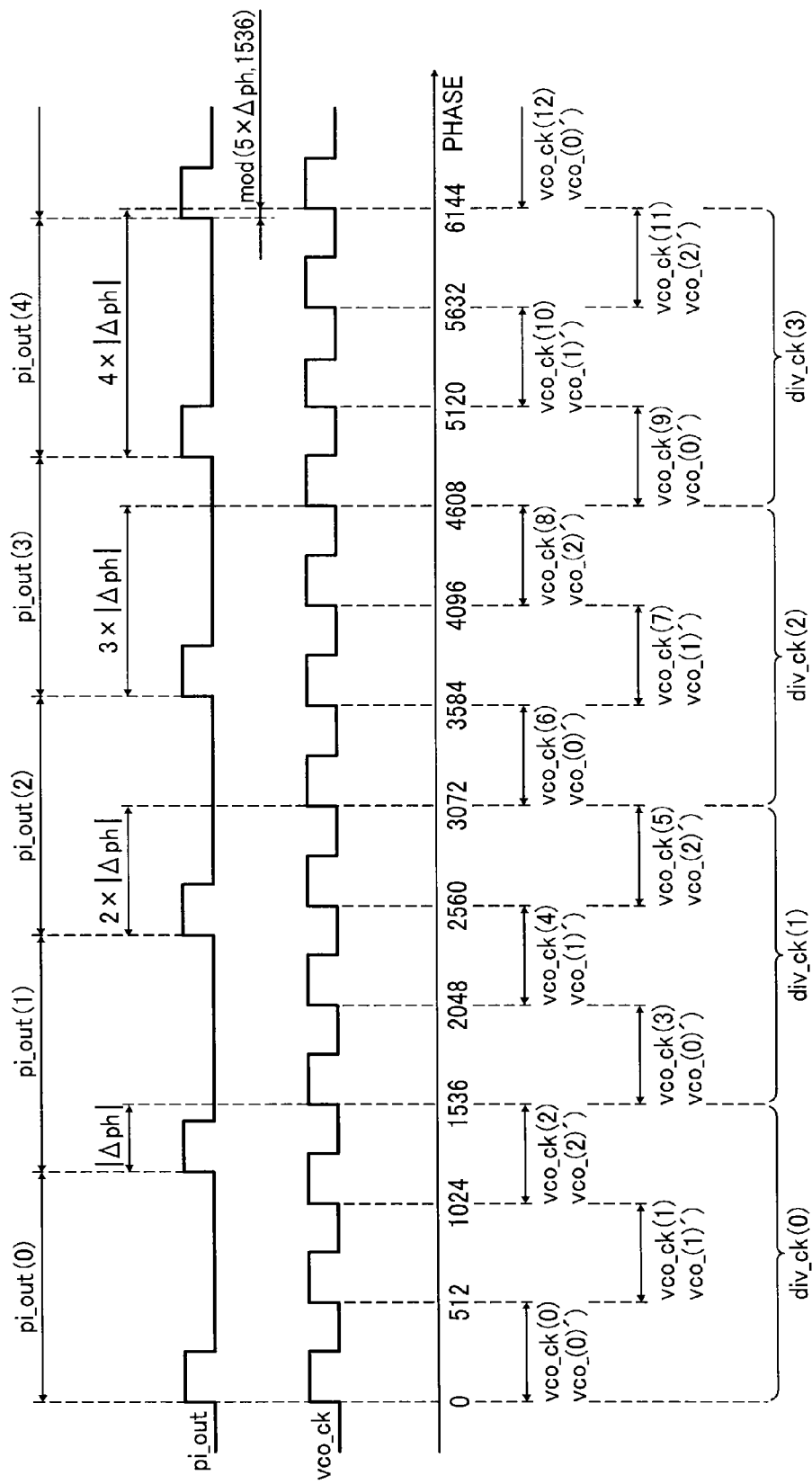
FIG. 10 is a timing chart indicating another phase shift in the case where the phase shift amount is negative.

FIG. 10 is a timing chart indicating a phase shift in the case where the phase shift amount Δph is negative. In the example illustrated in FIG. 10, the cycle of the phase-shifted clock signal pi_out is the cycle of three clocks of the output clock signal vco_ck (the cycle of the frequency-divided clock signal div_ck) decreased by the phase shift amount Δph. That is, the cycle of the phase-shifted clock signal pi_out becomes 512×3−|Δph|. Therefore, the rising edge of each clock of the phase-shifted clock signal pi_out is decreased and advanced every clock by the phase shift amount |Δph| from the rising edge after three clocks of the output clock signal vco_ck. Note that it is also assumed that the rising edge of the first clock vco_ck(0) of the output clock signal matches the rising edge of the first clock pi_out(0) of the phase-shifted clock signal pi_out.

The rising edge of the second clock pi_out(1) of the phase-shifted clock signal is advanced by the phase shift amount |Δph| from the rising edge of the fourth clock vco_ck(3) of the output clock signal. The rising edge of the third clock pi_out(2) of the phase-shifted clock signal is advanced by twice the phase shift amount |Δph| from the rising edge of the seventh clock vco_ck(6) of the output clock signal. In this manner, the rising edge of the n-th clock pi_out(n−1) of the phase-shifted clock signal is advanced by an n−1 multiple of the phase shift amount Δph from the rising edge of the (3n−2)-th clock vco_ck(3n−3) of the output clock signal.

Figure 11:
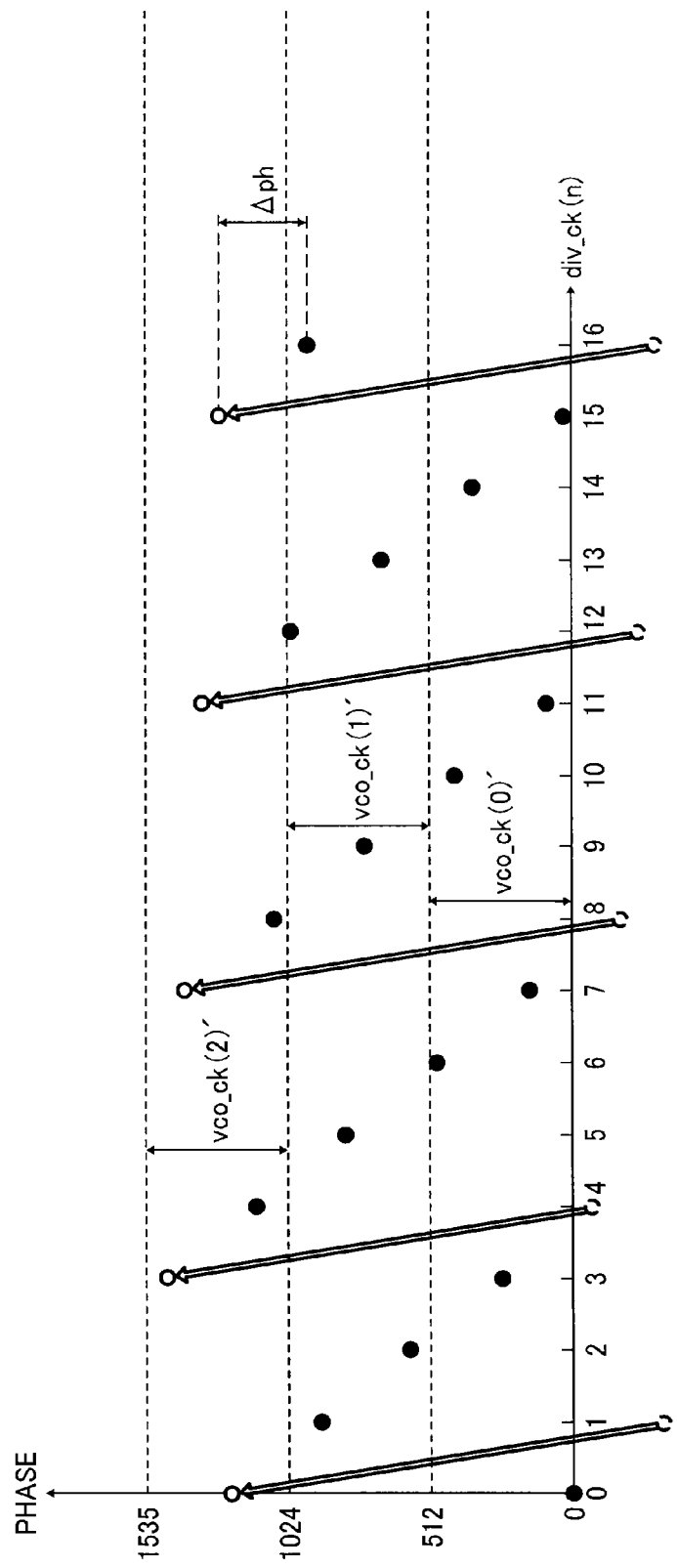
FIG. 11 is a diagram illustrating a phase selected by the phase selecting circuit in the case of performing the phase shift illustrated in FIG. 10.

FIG. 11 is a diagram illustrating a phase selected by the phase selecting circuit 18. Every time the clock of the frequency-divided clock signal div_ck advances, the phase selecting circuit 18 selects a phase decreased by the phase shift amount |Δph|. In the case where the phase after the decrease by the phase shift amount |Δph| does not become negative, the rising edge of the next clock of the phase-shifted clock signal pi_out is positioned at a corresponding phase within the cycle of the next clock of the frequency-divided clock signal div_ck. Therefore, the phase selecting circuit 18 is able to select that corresponding phase.

In contrast, in the case where the phase after the decrease by the phase shift amount |Δph| becomes negative, the rising edge of the next clock of the phase-shifted clock signal pi_out is positioned at a phase obtained by adding 1536 to the phase after the decrease, which is within the cycle of the current clock of the frequency-divided clock signal div_ck. In this case, as illustrated in FIG. 10, the rising edge of the sixth clock pi_out(5) of the phase-shifted clock signal is positioned within the cycle of the fourth div_ck(3) of the frequency-divided clock signal. That position is the position obtained by subtracting mod(5×Δph, 1536), which is the remainder of the 5×Δph divided by 1536, from the rising edge of the fifth clock div_ck(4) of the frequency-divided clock signal. Therefore, in this case, the phase selecting circuit 18 is able to select a phase at that position.

By selecting the phase as described above, the cycle of each clock pi_out(0), pi_out(1), . . . , pi_out(n−1) of the phase-shifted clock signal can always be a length obtained by decreasing the cycle of three clocks of the output clock signal vco_ck by the phase shift amount |Δph|. Although the case where the division ratio setting values are set to 2 has been described so far, when the setting values are set to 1 or to 3 or greater, the phase can be determined and selected by a similar method.

In the case where the division ratio setting values div_puck, div_fb, and div_pll of the phase selecting circuit 18, the output frequency divider 16, and the frequency divider 19 are set to 1 or greater, the above-mentioned equation 1 can be modified as the following equation 5. In addition, the above-mentioned equation 3 can be modified as the following equation 6, and the above-mentioned equation 4 can be modified as the following equation 7.

$$f_{pi\_out} = \frac{f_{vco\_ck} \times 512}{512 \times (div\_pll + 1) \times (div\_puck + 1) + \Delta ph} \quad \text{[Formula 5]}$$

$$f_{comp\_ck} = f_{fb\_ck} = \frac{f_{pi\_out}}{div\_fb + 1} = \quad \text{[Formula 6]}$$

$$\frac{f_{vco\_ck} \times 512}{\{512 \times (div\_pll + 1) \times (div\_puck + 1) + \Delta ph\} \times (div\_fb + 1)}$$

-continued $$fvco\_ck = fcomp\_ck \times \{(div\_fb+1) \times (div\_pll+1) \times (div\_puck+1) + (div\_fb+1) \times \frac{\Delta ph}{512}\}$$ [Formula 7]

In the SSCG circuit 10 including the fractional PLL circuit, a smaller multiplication rate can be implemented by dividing the frequency by using the phase selecting circuit 18. In this case, the minimum multiplication rate M (%) can be obtained by the following equation 8.

$$M = \frac{(div\_fb+1) \times \Delta ph}{512} \times 100 \approx 0.2 \times (div\_fb+1)$$ [Formula 8]

In addition, the minimum unit of a change rate of the frequency fvco_ck of the output clock signal vco_ck can be represented by the following equation 9.

$$\frac{\Delta fvco\_ck}{fvco\_ck} \approx 1 + \frac{0.002}{(div\_pll+1) \times (div\_puck+1)}$$ [Formula 9]

Figure 12:
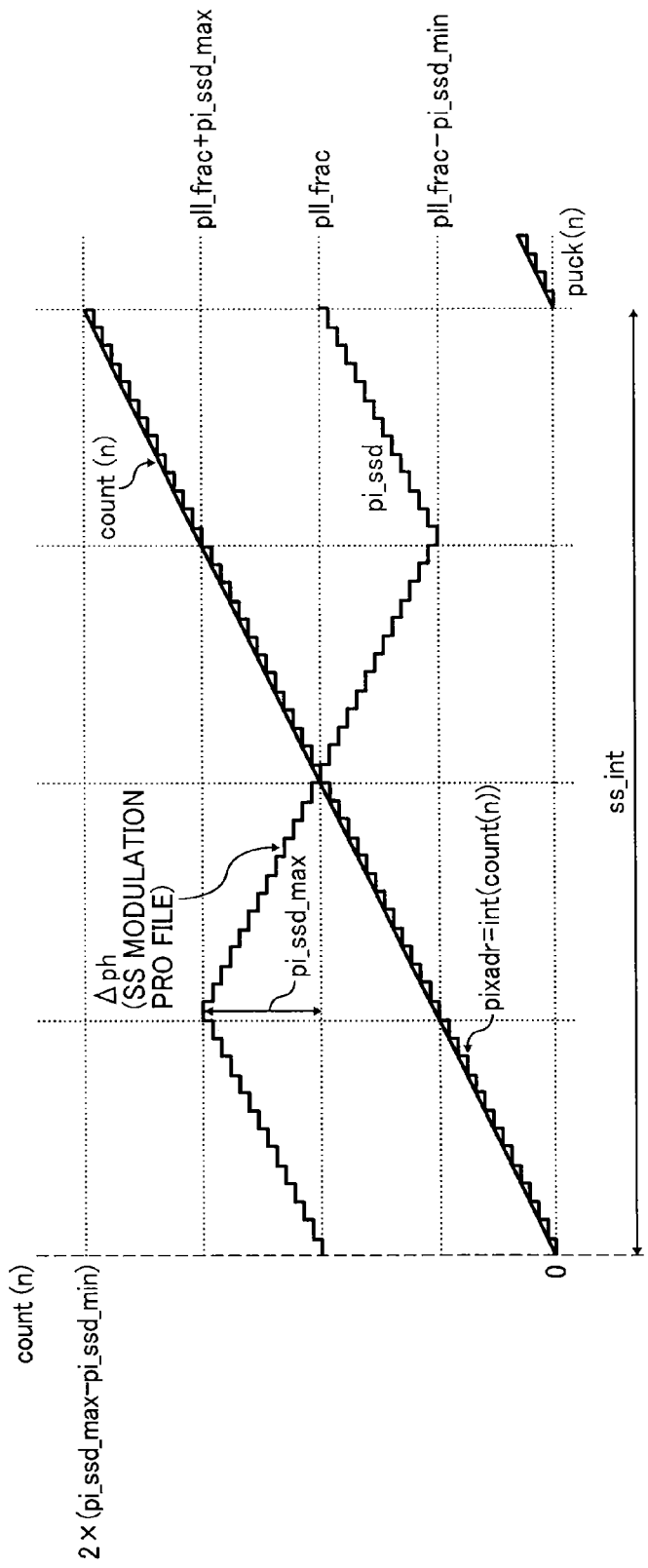
FIG. 12 is a diagram describing one case of spread-spectrum modulation performed by the phase selecting circuit.

Referring now to FIG. 12, spread-spectrum (SS) modulation performed by the phase controller 17 and the phase selecting circuit 18 will be described. The SSCG circuit 10 changes the cycle of the phase-shifted clock signal pi_out from the cycle of the output clock signal vco_ck by the phase shift amount Δph. In this case, the SSCG circuit 10 has a phase shift amount serving as the center of the phase shift amount Δph as a first phase shift amount pll_frac, changes the first phase shift amount pll_frac by a second phase shift amount pi_ssd, and performs SS modulation of the output clock signal vco_ck. That is, the frequency of the output clock signal vco_ck is slightly modulated by the second phase shift amount pi_ssd. With this SS modulation, the energy of EMI that has a peak at a particular frequency can be dispersed, thereby reducing the peak value.

The frequency of the output clock signal vco_ck changes in a triangular waveform, as illustrated in FIG. 12, in accordance with the division ratio setting values div_puck, div_fb, and div_pll of the phase selecting circuit 18, the output frequency divider 16, and the frequency divider 19, respectively, the modulation degree ss_amp, and the modulation cycle ss_int. In this case, the modulation degree is represented by a ratio between the difference between the maximum value and the minimum value of the amplitude of a modulated signal waveform, and the sum thereof. The modulation cycle is the cycle of a waveform pattern, such as a triangular wave, input for modulating the output clock signal vco_ck.

In order to perform SS modulation, it is assumed that the minimum time unit of changing the phase shift amount Δph is an SS modulation clock puck(0), puck(1), puck(2), ..., and puck(n). The SS modulation clock puck(n) is obtained by equally dividing the modulation cycle into a certain number. This is obtained by dividing the frequency of the clock of the output clock signal vco_ck using the division ratio of the output frequency divider 16 and the division ratio of the phase selecting circuit 18. From this, the frequency fpuck of the SS modulation clock puck(n) can be represented by the following equation 10.

$$fpuck = \frac{fpix\_ck}{div\_puck+1}$$ [Formula 10]

In equation 10, fpix_ck is the frequency of a pixel clock output from the output frequency divider 16, which can be calculated by the following equation 11.

$$fpix\_ck = \frac{fvco\_ck}{div\_pll+1}$$ [Formula 11]

As illustrated in FIG. 12, the phase shift amount Δph is stepwisely changed by a certain step size, every time section including a certain number of puck(n). Hereinafter, the time section is referred to as the step time section step_p. Accordingly, the phase shift amount Δph can be approximately changed in a triangular waveform. Note that the number of clocks of the SS modulation clock puck(n) in the step time section step_p is different in accordance with the settings.

The maximum value pi_ssd_max and the minimum value pi_ssd_min of the second phase shift amount pi_ssd in the case of changing the phase shift amount Δph in a triangular waveform can be calculated by the following equations 12 and 13. In equations 12 and 13, Δf_step is a value calculated from the minimum unit of the change rate of the frequency fvco_ck of the output clock signal vco_ck in the following equation 14. In equations 12 and 13, the int function is a function that truncates a number at the decimal point.

$$pi\_ssd\_max = int\left(\frac{ss\_amp}{1024 \times \Delta f\_step}\right)$$ [Formula 12]

$$pi\_ssd\_min = -int\left(\frac{ss\_amp}{1024 \times \Delta f\_step}\right)$$ [Formula 13]

$$\Delta f\_step = \frac{1}{512 \times \{(div\_pll+1) \times (div\_puck+1)\}}$$ [Formula 14]

The modulation degree ss_amp takes an integer value from 0 to 31, and the maximum change rate of the frequency of the output clock signal vco_ck is represented by ss_amp/1024(%). For example, if ss_amp=31, the frequency of the output clock signal vco_ck increases by about 3.1% with respect to the central frequency fc at the maximum value fmax, and decreases by about 3.1% with respect to the central frequency fc at the minimum value fmin.

Next, in order to calculate the second phase shift amount pi_ssd, a count value count(n) that increases every modulation clock puck(n) is introduced. The count value count(n) and its step size Δcount are each represented by, for example, a decimal including a 9-bit integer part and a 16-bit decimal part. The step size Δcount of the count value, the initial value count(0) of the count value, and the count value count(n) can be represented by the following equations 15 to 17.

$$\Delta count = \frac{2 \times (pi\_ssd\_max - pi\_ssd\_min)}{ss\_int}$$ [Formula 15]

$$count(0) = 0$$ [Formula 16]

$$count(n) = count(n-1) + \Delta count, \ 1 \leq n \leq ss\_int - 1$$ [Formula 17]

The count value count(n) increases at a time by the step size Δcount throughout the modulation cycle ss_int. Therefore, the second phase shift amount pi_ssd can be calculated by the following equations 18 to 20 in accordance with the count value count(n). Equation 18 corresponds to the case in which the decimal-truncated count value int(count(n)) is greater than or equal to 0 and less than pi_ssd_max+1, and equation 19 corresponds to the case in which the count value int(count(n)) is greater than or equal to pi_ssd_max+1 and less than pi_ssd_max+1+(pi_ssd_max-pi_ssd_min). Equation 20 corresponds to the case in which the count value int(count(n)) is greater than or equal to pi_ssd_max+1+(pi_ssd_max-pi_ssd_min) and is less than 2×(pi_ssd_max-pi_ssd_min).

$$pi\_ssd = \text{int}(count(n)) \quad \text{[Formula 18]}$$

$$pi\_ssd = pi\_ssd\_max - \{\text{int}(count(n)) - pi\_ssd\_max\} \quad \text{[Formula 19]}$$

$$pi\_ssd = pi\_ssd\_min + \{\text{int}(count(n)) - (2 \times pi\_ssd\_max - pi\_ssd\_min)\} \quad \text{[Formula 20]}$$

Figure 13:
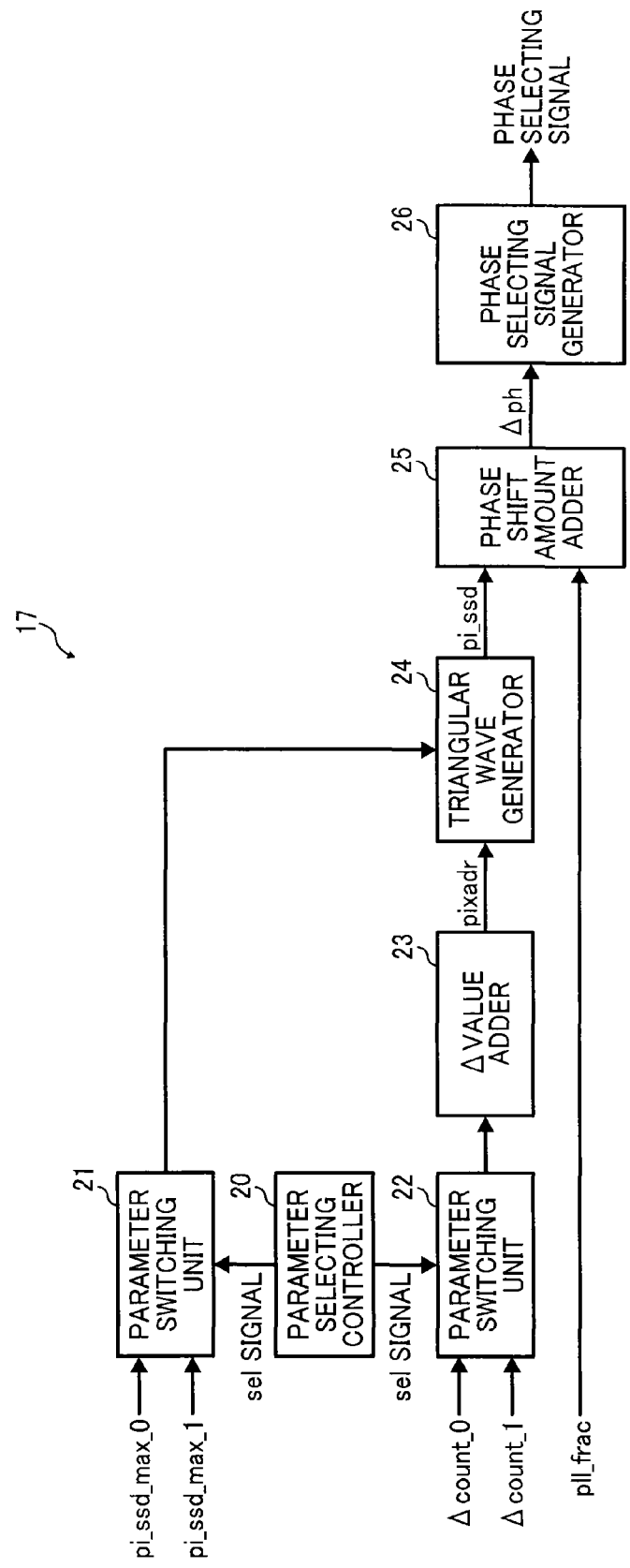
FIG. 13 is a block diagram illustrating an exemplary configuration of a phase controller.

FIG. 13 is a functional block diagram of the phase controller 17. The phase controller 17 can perform all of the above-mentioned calculations within the circuit. However, the phase controller 17 is not limited to that described above. Alternatively, for example, parameter values of the maximum phase shift amount pi_ssd_max, which is the modulation width, and the phase shift amount increase Δcount every modulation clock (puck) may be calculated in advance, and these parameter values may be substituted into the phase controller 17. In this case, using the above-mentioned parameter values for specifying the modulation width and the phase shift amount increase, the phase controller 17 adds the Δcount value to generate a triangular wave, thereby generating the second phase shift amount pi_ssd. In addition, by adding the second phase shift amount pi_ssd and the first phase shift amount pll_frac, the phase shift amount Δph to be output to the phase selecting circuit 18, such as that illustrated in FIG. 12, can be obtained. Accordingly, the phase selecting circuit 18 can generate an SS-modulated clock signal.

To interpolate a triangular wave with a small modulation width at a certain time interval while performing SS modulation, two different parameter values for generating a triangular wave are prepared. A parameter selecting controller 20 outputs a selection (sel) signal, and parameter switching units 21 and 22 switch their parameters at a certain time interval, thereby interpolating the above-mentioned small triangular wave. Therefore, the phase controller 17 can include the parameter selecting controller 20 and the parameter switching units 21 and 22.

Figure 14A:
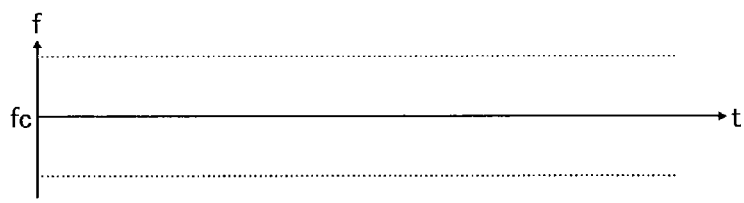
FIGS. 14A to 14F are diagrams describing the relationship between a clock frequency output from the SSCG circuit, and time.
Figure 14B:
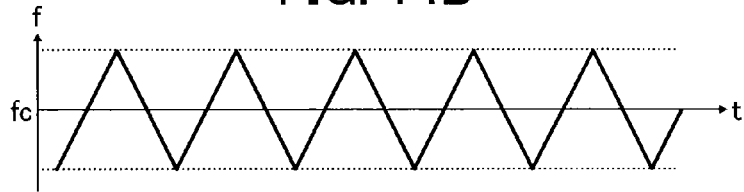

In this case, the relationship between the frequency of a clock signal output from the SSCG circuit 10 and time will be described with reference to FIGS. 14A to 14F. FIG. 14A is a diagram illustrating the relationship between the frequency of a clock signal and time in the case of not performing SS modulation. Since no SS modulation is performed, the relationship is constant at the central frequency fc. FIG. 14B is a diagram illustrating the relationship between the frequency of a clock signal and time in the case of performing SS modulation at a certain modulation width. Since only SS modulation is performed, a triangular waveform pattern that has a certain modulation width is generated. This waveform pattern has the central frequency fc as a reference, and has frequencies higher and lower than the reference. By performing modulation based on this triangular wave, a peak at a particular frequency can be dispersed to frequencies around that particular frequency, thereby reducing the peak value.

Figure 14C:
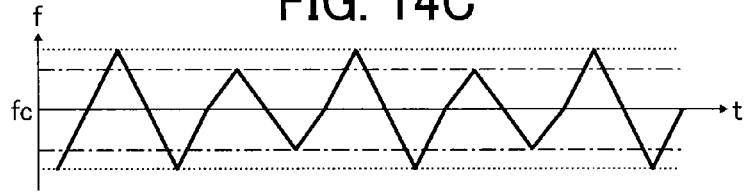

FIG. 14C is a diagram illustrating the relationship between the frequency of a clock signal and time in the case of interpolating a triangular wave with a small modulation width at a certain time interval while performing SS modulation at a certain modulation width. A triangular wave with a small modulation width is interpolated in the cycle of the second clock and the cycle of the fourth clock, and the maximum value and the minimum value of peaks in these cycles are smaller than peaks in other cycles, such as the cycle of the first clock.

Figure 14D:
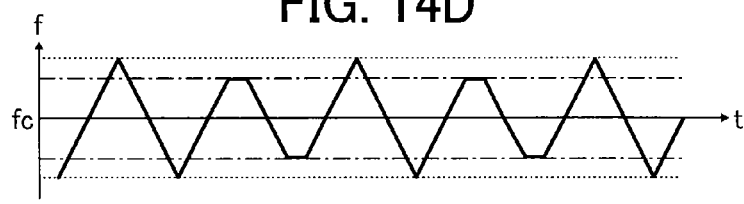
Figure 14E:
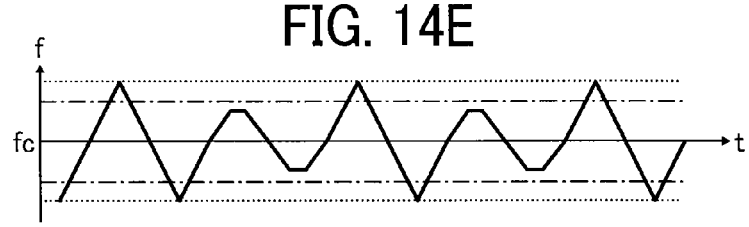

FIG. 14D is a diagram illustrating the relationship between the frequency of a clock signal and time in the case of interpolating a trapezoidal wave without the peak of a triangular wave at a certain time interval while performing SS modulation at a certain modulation width. A trapezoidal wave is interpolated in the cycle of the second clock and the cycle of the fourth clock. FIG. 14E is a diagram illustrating the relationship between the frequency of a clock signal and time in the case of alternately interpolating a trapezoidal wave without the peak of a triangular wave with a small modulation width into that triangular wave at a certain time interval while performing SS modulation at a certain modulation width. A triangular wave with a small modulation width is interpolated in the cycle of the second clock and the cycle of the fourth clock, and a trapezoidal wave is interpolated into that triangular wave.

Figure 14F:
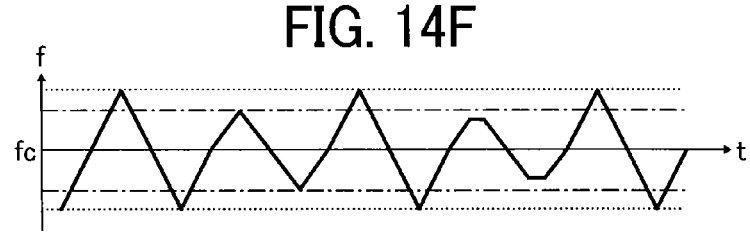

FIG. 14F is a diagram illustrating the relationship between the frequency of a clock signal and time in the case of alternately interpolating a triangular wave with a small modulation width and a trapezoidal wave without the peak of the triangular wave at a certain time interval while performing SS modulation at a certain modulation width. A triangular wave with a small modulation width is interpolated in the cycle of the second clock, and a trapezoidal wave without the peak of a triangular wave with a small modulation width is interpolated in the cycle of the fourth clock.

This waveform pattern can be generated by outputting, from the parameter selecting controller 20, a sel signal at the time point of a zero-crossing of SS modulation every SS modulation cycle, and switching, by the parameter switching units 21 and 22, the parameters at that time point. The time point of a zero-crossing of SS modulation is the time point at which each waveform crosses 0 in the case where the central frequency fc, serving as a reference in FIGS. 14A to 14F, is 0. In this case, since this is performed every SS modulation cycle, the rising of a waveform becomes a time point where the waveform crosses 0.

In addition to the above-described components, the phase controller 17 includes a Δvalue adder 23 that adds the parameter value of Δcount input by switching, by the parameter switching unit 22, between Δcount_0 and Δcount_1 serving as a parameter. The phase controller 17 further includes a triangular wave generator 24 that generates the above-mentioned triangular wave. The triangular wave generator 24 generates a triangular wave on the basis of the parameter value of pi_ssd_max input by switching, by the parameter switching unit 21, between pi_ssd_max_0 and pi_ssd_max 1 serving as a parameter, and the parameter value added by the Δvalue adder 23.

The triangular wave generator 24 generates a waveform pattern from a pair of the input parameters Δcount_0 and pi_ssd_max_0, and generates another waveform pattern from another pair of the input parameters Δcount_1 and pi_ssd_max_1. These parameters are switched by the parameter selecting controller 20 and the parameter switching units 21 and 22 at a certain time interval. Therefore, the triangular wave generator 24 generates a waveform pattern by switching between these two waveform patterns at a certain time interval. Specifically, the triangular wave generator 24 generates the waveform pattern illustrated in FIG. 14C.

The phase controller 17 includes a phase shift amount adder 25 that adds the second phase shift amount pi_ssd with the waveform pattern of a triangular wave generated by the triangular wave generator 24 and the input first phase shift amount pll_frac, thereby calculating the phase shift amount Δph. The phase controller 17 also includes a phase selecting signal generator 26 that determines the phase of a rising edge of the phase-shifted clock signal pi_out on the basis of the cycle of the output clock signal vco_ck and the calculated phase shift amount Δph, and generates a signal for selecting that phase. The phase selecting signal generator 26 determines the above-mentioned phase so that the cycle of the phase-shifted clock signal pi_out matches the cycle of the output clock signal vco_ck changed by the first phase shift amount pll_frac to which the above-mentioned second phase shift amount pi_ssd is added. The phase selecting signal generator 26 outputs the generated phase selecting signal to the phase selecting circuit 18.

Figure 15A:
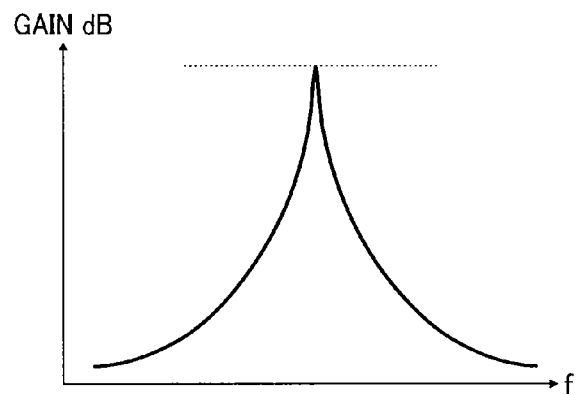
FIGS. 15A to 15C are diagrams describing spread spectrum effect.
Figure 15B:
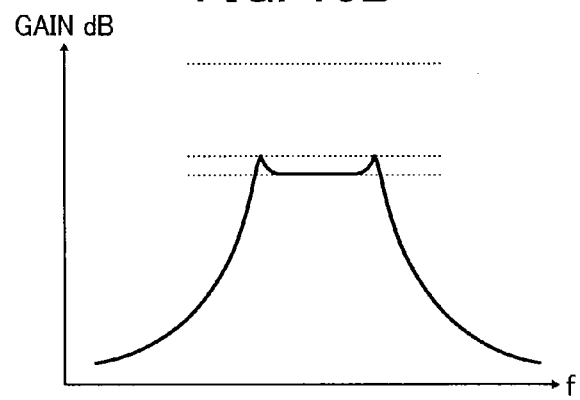
Figure 15C:
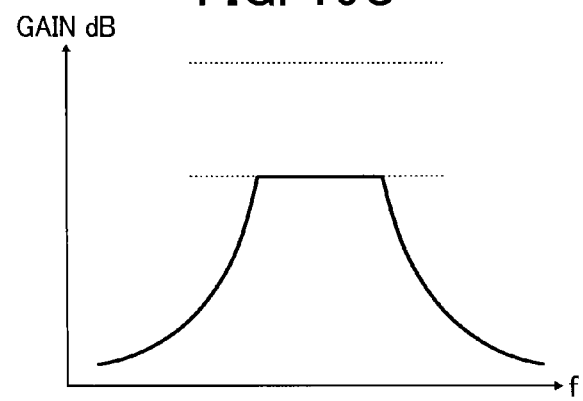

Referring to FIGS. 15A to 15C, the effects of the SS modulation performed by the SSCG circuit 10 will be described. FIG. 15A is a diagram illustrating spectrum characteristics of a clock signal in the case of not performing SS modulation, which is illustrated in FIG. 14A. This spectrum has one large peak. Here, the term "spectrum" indicates a gain distribution for each frequency. The gain is the amplitude ratio of an output clock signal to an input clock signal.

FIG. 15B is a diagram illustrating spectrum characteristics of a clock signal in the case of performing SS modulation, which is illustrated in FIG. 14B. This spectrum is smoothed and peaks are lowered, compared with the case of not performing SS modulation, and two peaks are generated at two ends of the smoothed spectrum. For example, the frequency of a clock signal (to spread the spectrum) may be modulated, so as to disperse the energy of EMI that has a peak at a particular frequency and reduce the peak value. More specifically, a spread spectrum clock generating (SSCG) circuit may be provided, which spreads the width of a pointed spectrum with a peak at a particular frequency, to reduce the peak value and smoothen the spectrum. However, in this SSCG circuit, two peaks are generated at two ends of the smoothed spectrum of an output clock signal, and accordingly, the EMI reduction effect is weakened. Therefore, although the EMI reduction effect can be achieved, that effect is weak.

Since the peaks illustrated in FIG. 15B are generated in the case of performing SS modulation at a certain modulation width, it is conceivable that this is caused by the fact that the proportion changed to frequencies in the vertex portion of the triangular wave illustrated in FIG. 14B is great. Therefore, these peaks can be prevented from occurring by interpolating a triangular wave with a waveform whose height of the vertex, namely, modulation width, is appropriately made small.

FIG. 15C is a diagram illustrating spectrum characteristics of a clock signal in the case of interpolating a triangular wave with a small modulation width at a certain time interval while performing SS modulation, which is illustrated in FIG. 14C. In this case, the spectrum is smoothed while peaks are prevented from occurring at two ends thereof, and the EMI reduction effect that is higher than the case of FIG. 15B can be achieved.

Figure 16:
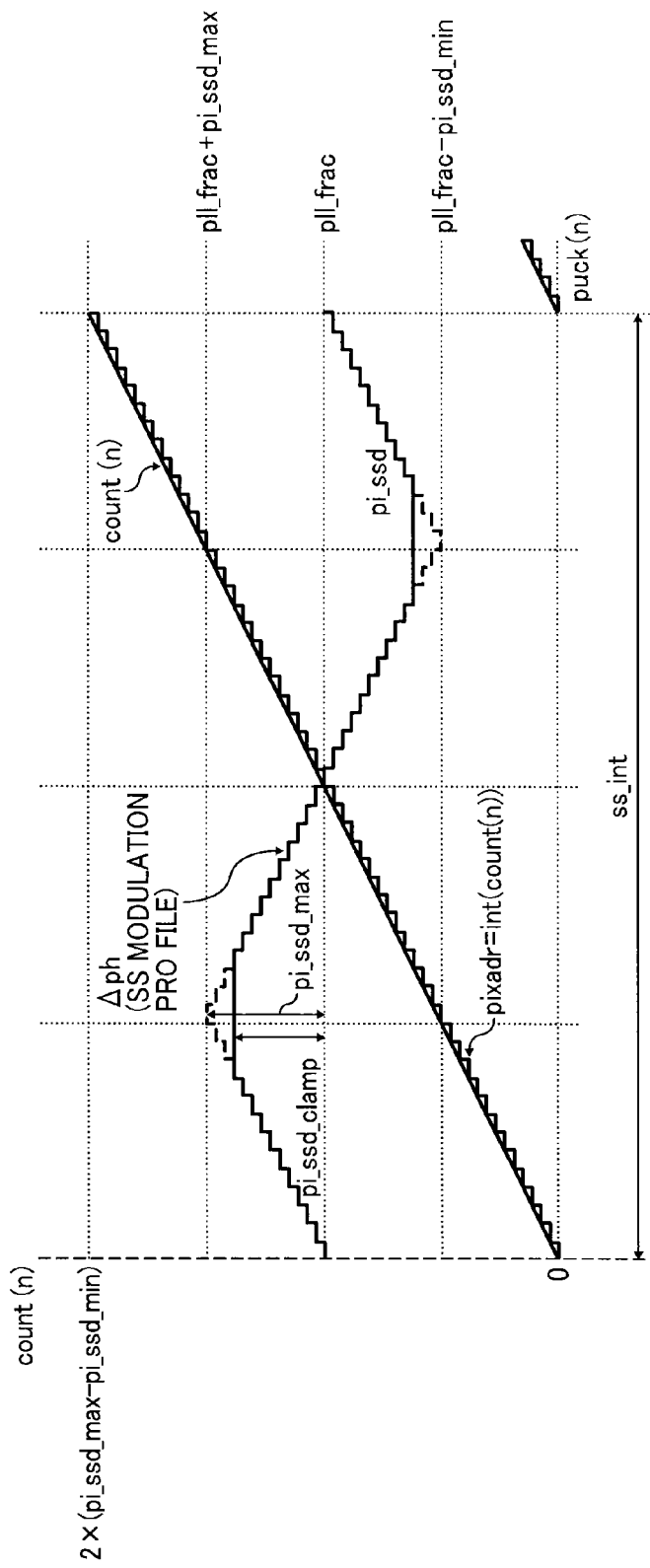
FIG. 16 is a diagram describing another case of spread-spectrum modulation performed by the phase selecting circuit.
Figure 17:
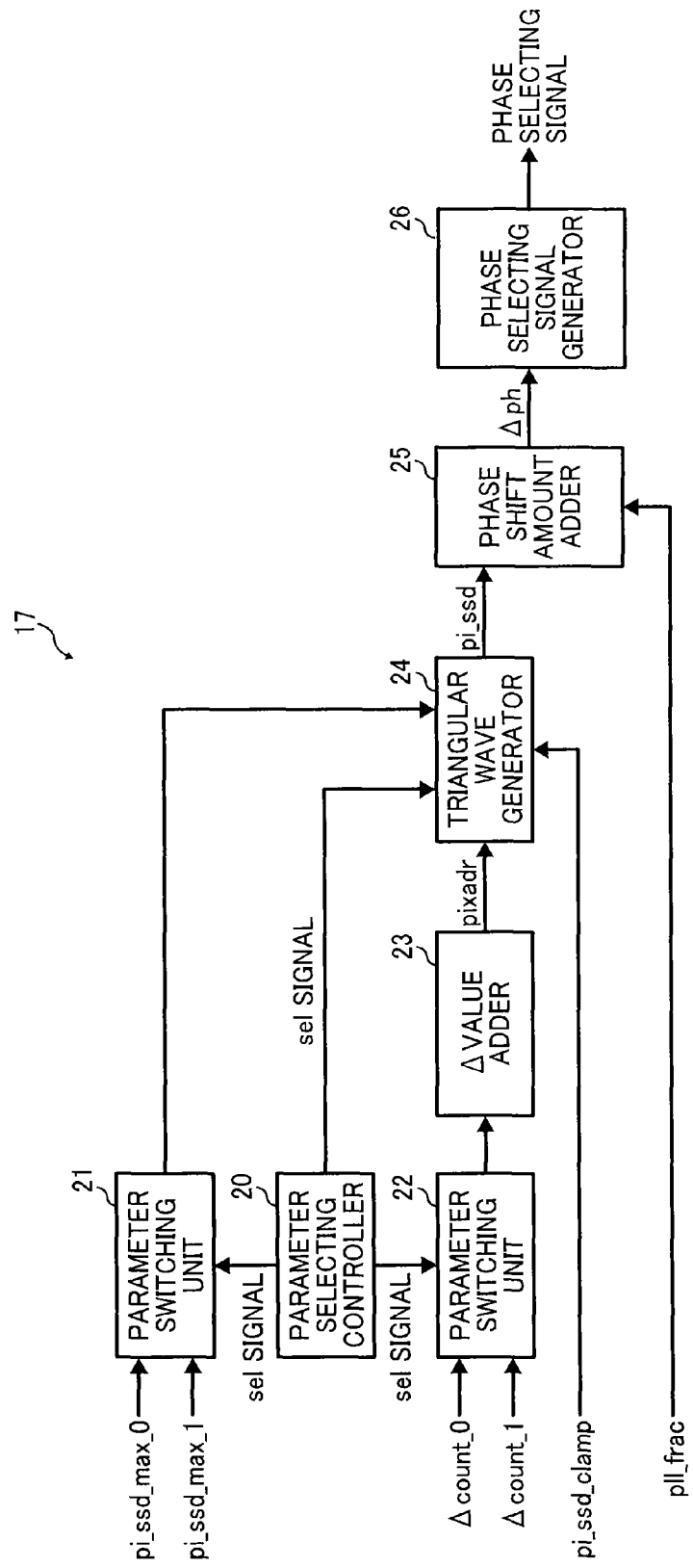
FIG. 17 is a block diagram illustrating another exemplary configuration of the phase controller.

The examples of interpolating a triangular wave with a small modulation width at a certain interval have been described with reference to FIGS. 12 and 13 so far. Referring now to FIGS. 16 and 17, an example of interpolating a trapezoidal wave that does not have the peak of a triangular wave at a certain time interval will be described. Like FIG. 12, FIG. 16 is a diagram for describing spread-spectrum (SS) modulation performed by the phase controller 17 and the phase selecting circuit 18. In this example, a triangular wave clamp function is added in order to interpolate, instead of a triangular wave, a trapezoidal wave, which is one type of rectangular wave obtained by smoothing a triangular wave so as to eliminate the vertex. That is, at the time of generating a triangular wave, when the value of the second phase shift amount pi_ssd is greater than or less than a clamp setting value pi_ssd_clamp, the pi_ssd value is clamped (fixed) so as not to become greater than or less than the clamp setting value. Accordingly, a trapezoidal wave that has a smoothed top and has no peak can be obtained.

In order to implement this, as illustrated in FIG. 17, the phase controller 17 holds the clamp setting value, which is a parameter for the parameter selecting controller 20 to control the modulation width, and outputs that clamp setting value to the triangular wave generator 24. Accordingly, the triangular wave generator 24 can determine whether the value of the second phase shift amount pi_ssd is greater than or less than the clamp setting value pi_ssd_clamp, and clamp the pi_ssd value so as not to become greater than or less than the clamp setting value.

Note that the clamp setting value pi_ssd_clamp may be a fixed value or a value that can be set from the outside. In the case where the clamp setting value pi_ssid is a value that can be set from the outside, the degree of freedom in generating a trapezoidal wave becomes higher, which is desirable.

To interpolate the trapezoidal wave illustrated in FIG. 14D, this can be implemented by switching the clamp setting between valid and invalid every SS modulation cycle by using a sel signal. A wave that is interpolated is not limited only to a trapezoidal wave. For example, the waveforms illustrated in FIGS. 14E and 14F or other waveforms can be easily implemented by using a combination of a sel signal that switches to the above-mentioned triangular wave with a small modulation width and a sel signal that switches to a trapezoidal wave.

Besides interpolating a triangular wave with a small modulation width, by interpolating a trapezoidal wave or a waveform combining the triangular wave and the trapezoidal wave, as illustrated in FIG. 15C, no peaks are generated at two ends of the spectrum, and the spectrum is smoothed. Therefore, the high EMI reduction effect can be achieved by interpolating these waveforms.

Since this can be done simply by changing two parameters including the maximum phase shift amount pi_ssd_max, which is the modulation width, and the phase shift amount increase Δcount every modulation clock, or three parameters additionally including the clamp value pi_ssd_clamp, this can be implemented by a simple circuit. As a result, the cost of the apparatus can be made less expensive.

Figure 18:
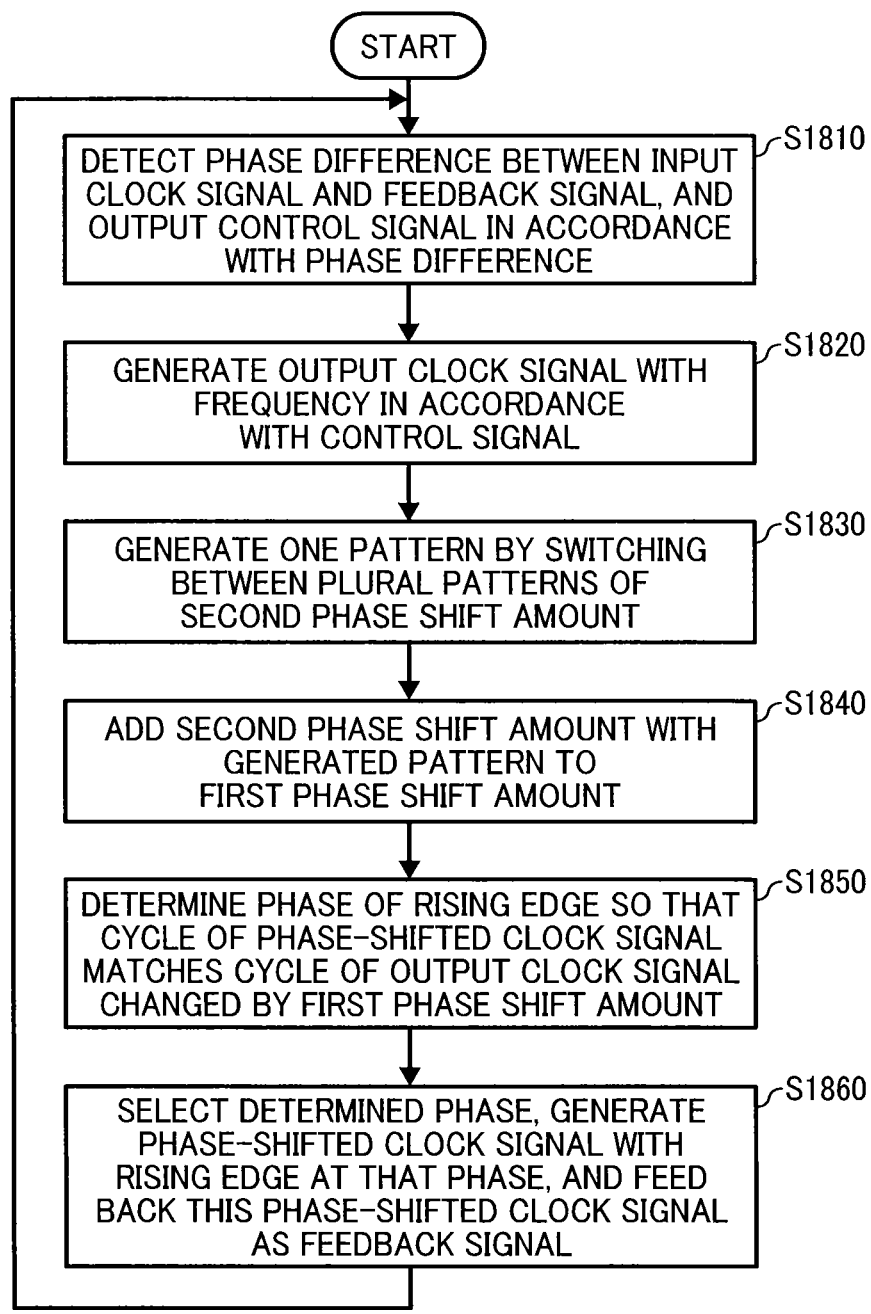
FIG. 18 is a flowchart illustrating the flow of an operation performed by the SSCG circuit.

Referring to FIG. 18, an operation executed by the SSCG circuit 10 will be briefly described. The operation starts in step S1800. In step S1810, the phase frequency comparator 12 detects the phase difference between the input clock signal comp_ck and the feedback signal fb_ck, and the charge pump 13 increases/decreases a charge pump voltage in accordance with the phase difference, and outputs the increased/decreased charge pump voltage. The loop filter 14 generates a controlled voltage in accordance with the charge pump voltage, and outputs the controlled voltage as a control signal.

In step S1820, the VCO 15 generates an output clock signal that has a frequency in accordance with the control signal. Next, the phase controller 17 determines a phase to be selected by the phase selecting circuit 18, on the basis of the cycle of the generated output clock signal and a first phase shift amount.

In this case, in step S1830, the phase controller 17 generates a pattern by switching, at a certain time interval, between a plurality of patterns of a second phase shift amount that periodically changes every certain time. In step S1840, the phase controller 17 adds the first phase shift amount pll_frac to the second phase shift amount pi_ssd which has the generated pattern. In step S1850, the phase controller 17 determines the phase so that the cycle of the phase-shifted clock signal pi_out matches the cycle of the output clock signal vco_ck changed by the first phase shift amount pll_frac to which the second phase shift amount pi_ssd is added.

In step S1860, the phase selecting circuit 18 selects the determined phase from among a plurality of phases obtained by equally dividing one cycle of the generated output clock signal vco_ck into a certain number. The phase selecting circuit 18 generates the phase-shifted clock signal pi_out whose signal level changes in the selected phase, and outputs the generated phase-shifted clock signal pi_out as a feedback signal fb_ck to the phase frequency comparator 12. This operation is repeated to perform feedback control.

As has been described above, according to the present invention, peaks are prevented from occurring in the smoothed spectrum of an output clock signal, and hence, the EMI reduction effect can be enhanced.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC) and conventional circuit components arranged to perform the recited functions.

The present invention can be implemented in any convenient form, for example using dedicated hardware, or a mixture of dedicated hardware and software. The present invention may be implemented as computer software implemented by one or more networked processing apparatuses. The network can comprise any conventional terrestrial or wireless communications network, such as the Internet. The processing apparatuses can compromise any suitably programmed apparatuses such as a general purpose computer, personal digital assistant, mobile telephone (such as a WAP or 3G-compliant phone) and so on. Since the present invention can be implemented as software, each and every aspect of the present invention thus encompasses computer software implementable on a programmable device. The computer software can be provided to the programmable device using any storage medium for storing processor readable code such as a floppy disk, hard disk, CD ROM, magnetic tape device or solid state memory device.

The hardware platform includes any desired kind of hardware resources including, for example, a central processing unit (CPU), a random access memory (RAM), and a hard disk drive (HDD). The CPU may be implemented by any desired kind of any desired number of processor. The RAM may be implemented by any desired kind of volatile or non-volatile memory. The HDD may be implemented by any desired kind of non-volatile memory capable of storing a large amount of data. The hardware resources may additionally include an input device, an output device, or a network device, depending on the type of the apparatus. Alternatively, the HDD may be provided outside of the apparatus as long as the HDD is accessible. In this example, the CPU, such as a cache memory of the CPU, and the RAM may function as a physical memory or a primary memory of the apparatus, while the HDD may function as a secondary memory of the apparatus.

What is claimed is:

1. A clock signal generating apparatus, comprising:
circuitry configured to:
detect a phase difference between an input reference clock signal serving as a reference and a feedback signal, and output a control signal in accordance with the phase difference;
a generate a clock signal with a frequency in accordance with the control signal;
determine one of a plurality of phases to be selected based on a cycle of the clock signal and a first phase shift amount determined in advance for changing the cycle of the clock signal; and
select the one of the plurality of phases obtained by equally dividing one cycle of the clock signal into a certain number, generate a phase-shifted clock signal whose signal level changes in the selected one of the plurality of phase, and output the generated phase-shifted clock signal as another feedback signal,
wherein the circuitry is configured to generate a pattern by switching, at a certain time interval, between a plurality of patterns of a second phase shift amount that periodically changes every certain time, add the first phase shift amount to the second phase shift amount having the generated pattern, and determine the one of the plurality of phases to be selected so that a cycle of the phase-shifted clock signal matches the cycle of the clock signal changed by the first phase shift amount to which the second phase shift amount having the generated pattern is added.

2. The clock signal generating apparatus according to claim 1, wherein the plurality of patterns include a plurality of waveform patterns for modulating the clock signal, the plurality of waveform patterns at least including a waveform pattern of a first triangular wave having a certain modulation width.

3. The clock signal generating apparatus according to claim 2, wherein the plurality of patterns further include a waveform pattern of a second triangular wave having a modulation width smaller than that of the first triangular wave.

4. The clock signal generating apparatus according to claim 2, wherein the plurality of patterns further include a waveform pattern of a trapezoidal wave obtained by smoothing the first triangular wave so as to eliminate a vertex.

5. The clock signal generating apparatus according to claim 2, wherein the plurality of patterns further include a waveform pattern of a trapezoidal wave obtained by smoothing a second triangular wave having a modulation width smaller than that of the first triangular wave so as to eliminate a vertex.

6. The clock signal generating apparatus according to claim 1, wherein the circuitry is configured to select one of a plurality of first parameters for designating a modulation width and one of a plurality of second parameters for designating an increase in the second phase shift amount every modulation clock obtained by equally dividing a modulation cycle of a waveform pattern into a certain number, and, using the selected one of the plurality of first parameters and the selected one of the plurality of second parameters, to generate one of the plurality of patterns.

7. The clock signal generating apparatus according to claim 6, wherein the circuitry is configured to select a third parameter that controls the modulation width, and generate the one of the plurality of patterns using the selected one of the plurality of first parameters, the selected one of the plurality of second parameters, and the third parameter.

8. The clock signal generating apparatus according to claim 1, wherein the circuitry is configured to switch between the plurality of patterns at a time where a frequency of a first triangular wave having a certain modulation width, which crosses a reference frequency and which periodically changes, crosses the reference frequency every cycle.

9. A method for generating a clock signal, comprising:
detecting, using circuitry, a phase difference between an input reference clock signal serving as a reference and a feedback signal to output a control signal in accordance with the phase difference;
generating the clock signal with a frequency in accordance with the output control signal;
generating a pattern by switching, at a certain time interval, between a plurality of patterns of a second phase shift amount that periodically changes every certain time;
adding a first phase shift amount to the second phase shift amount having the generated pattern, the first phase shift amount being determined in advance for changing a cycle of the generated clock signal;
determining, using the circuitry, a phase to be selected, so that a cycle of a phase-shifted clock signal matches the cycle of the clock signal changed by the first phase shift amount to which the second phase shift amount having the generated pattern is added;
selecting the determined phase from among a plurality of phases obtained by equally dividing one cycle of the generated clock signal into a certain number; and
generating the phase-shifted clock signal whose signal level changes in the selected determined phase for output as another feedback signal.

10. A non-transitory recording medium which, when executed by one or more processors, cause the processors to perform a method for generating a clock signal, the method comprising:

detecting a phase difference between an input reference clock signal serving as a reference and a feedback signal to output a control signal in accordance with the phase difference;
generating the clock signal with a frequency in accordance with the output control signal;
generating a pattern by switching, at a certain time interval, between a plurality of patterns of a second phase shift amount that periodically changes every certain time;
adding a first phase shift amount to the second phase shift amount having the generated pattern, the first phase shift amount being determined in advance for changing a cycle of the generated clock signal;
determining a phase to be selected, so that a cycle of a phase-shifted clock signal matches the cycle of the clock signal changed by the first phase shift amount to which the second phase shift amount having the generated pattern is added;
selecting the determined phase from among a plurality of phases obtained by equally dividing one cycle of the generated clock signal into a certain number; and
generating the phase-shifted clock signal whose signal level changes in the selected determined phase for output as another feedback signal.

11. The method of claim 9, wherein the plurality of patterns include a plurality of waveform patterns for modulating the clock signal, the plurality of waveform patterns at least including a waveform pattern of a first triangular wave having a certain modulation width.

12. The method of claim 11, wherein the plurality of patterns further include a waveform pattern of a second triangular wave having a modulation width smaller than that of the first triangular wave.

13. The non-transitory recording medium of claim 10, wherein the plurality of patterns include a plurality of waveform patterns for modulating the clock signal, the plurality of waveform patterns at least including a waveform pattern of a first triangular wave having a certain modulation width.

14. The non-transitory recording medium of claim 13, wherein the plurality of patterns further include a waveform pattern of a second triangular wave having a modulation width smaller than that of the first triangular wave.

15. The clock signal generating apparatus according to claim 1, wherein the circuitry is configured to generate the clock signal with a phase in accordance with the control signal.

16. The clock signal generating apparatus according to claim 1, wherein the circuitry is configured to increase or decrease a charge pump voltage in accordance with the phase difference, and to generate a controlled voltage as the control signal in accordance with the charge pump voltage.

* * * * *

UNITED STATES PATENT AND TRADEMARK OFFICE
CERTIFICATE OF CORRECTION

Page 1 of 1

| | |
|---|---|
| PATENT NO. | : 9,742,447 B2 |
| APPLICATION NO. | : 14/969524 |
| DATED | : August 22, 2017 |
| INVENTOR(S) | : Yasuhiro Izawa |

It is certified that error appears in the above-identified patent and that said Letters Patent is hereby corrected as shown below:

On the Title Page

Item (30), the Foreign Application Priority Data has been omitted. Item (30) should read:

-- (30)   Foreign Application Priority Data
Dec. 26, 2014 (JP) ........................ 2014-264235 --

Signed and Sealed this
Twenty-fourth Day of April, 2018

Andrei Iancu
*Director of the United States Patent and Trademark Office*